United States Patent
Ishibashi

(10) Patent No.: US 10,389,006 B2
(45) Date of Patent: Aug. 20, 2019

(54) ELECTRONIC APPARATUS AND MANUFACTURING METHOD THEREOF

(71) Applicant: FUJITSU LIMITED, Kawasaki-shi, Kanagawa (JP)

(72) Inventor: Daijiro Ishibashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 72 days.

(21) Appl. No.: 15/408,704

(22) Filed: Jan. 18, 2017

(65) Prior Publication Data
US 2017/0125871 A1  May 4, 2017

Related U.S. Application Data

(63) Continuation of application No. PCT/JP2014/070085, filed on Jul. 30, 2014.

(51) Int. Cl.
| | |
|---|---|
| *H01P 5/103* | (2006.01) |
| *H01P 3/06* | (2006.01) |
| *H01P 3/12* | (2006.01) |
| *H01P 11/00* | (2006.01) |
| *H01Q 13/10* | (2006.01) |

(52) U.S. Cl.
CPC .............. *H01P 5/103* (2013.01); *H01P 3/06* (2013.01); *H01P 3/12* (2013.01); *H01P 11/002* (2013.01); *H01L 2223/6677* (2013.01); *H01L 2224/04105* (2013.01); *H01L 2224/12105* (2013.01); *H01L 2224/96* (2013.01); *H01Q 13/10* (2013.01)

(58) Field of Classification Search
CPC .. H01P 3/12; H01P 3/06; H01P 11/002; H01P 5/107; H01P 3/003; H01P 3/121; H01P 5/103; H01P 1/207; H01L 23/48

USPC ............ 333/26, 34, 238, 239; 257/621, 774, 257/E23.011

See application file for complete search history.

(56) References Cited

U.S. PATENT DOCUMENTS

| | | | | |
|---|---|---|---|---|
| 3,212,030 A | * | 10/1965 | Millard | ..................... H01P 9/02 333/156 |
| 9,812,755 B2 | * | 11/2017 | Uemichi | ................. H01P 3/121 |

(Continued)

FOREIGN PATENT DOCUMENTS

| EP | 1 983 614 A1 | 10/2008 |
|---|---|---|
| EP | 2940784 A1 | 11/2015 |

(Continued)

OTHER PUBLICATIONS

International Search Report for International Application No. PCT/JP2014/070085 dated Oct. 21, 2014.

(Continued)

*Primary Examiner* — Benny T Lee
*Assistant Examiner* — Hafizur Rahman
(74) *Attorney, Agent, or Firm* — Kratz, Quintos & Hanson, LLP

(57) ABSTRACT

An electronic apparatus has a substrate having a signal terminal and a waveguide formed above the substrate. The waveguide includes a lower conductor having an opening at a position corresponding to the signal terminal of the substrate and an upper conductor arranged above the lower conductor. A conductor pin is formed on the signal terminal, the conductor pin penetrating the opening without contacting the lower conductor of the waveguide. The conductor pin is connected to the upper conductor above the lower conductor.

14 Claims, 25 Drawing Sheets

(56) References Cited

U.S. PATENT DOCUMENTS

| | | |
|---|---|---|
| 2005/0248419 A1 | 11/2005 | Freeman |
| 2009/0079648 A1 | 3/2009 | Matsuo |
| 2010/0001809 A1 | 1/2010 | Yanagisawa et al. |
| 2011/0084398 A1 | 4/2011 | Pilard et al. |
| 2015/0145145 A1* | 5/2015 | Tsuyutani ............... H01L 24/05 257/774 |

FOREIGN PATENT DOCUMENTS

| | | |
|---|---|---|
| JP | S53-129563 | 11/1978 |
| JP | H02-062103 | 3/1990 |
| JP | 2008-148041 A1 | 6/2008 |
| JP | 2012-175181 A1 | 9/2012 |
| WO | 2007/091470 A1 | 8/2007 |
| WO | 2014/104336 A1 | 7/2014 |

OTHER PUBLICATIONS

Written Opinion of the International Searching Authority for International Application No. PCT/JP2014/070085 dated Oct. 21, 2014 (3 Sheets, 2 Sheets translation, 5 Sheets total).

European Patent Application No. 14898693.8: Extended European Search Report dated Jul. 17, 2017.

Japanese Office Action for corresponding Japanese Application No. 2016-537656 dated Oct. 3, 2017 (2 Sheets, 2 Sheets translation, 4 Sheets total).

* cited by examiner

ELECTRONIC APPARATUS AND MANUFACTURING METHOD THEREOF

CROSS-REFERENCE TO RELATED APPLICATION

This application is a continuation application of International Application PCT/JP2014/070085 filed on Jul. 30, 2014 which designated the U.S., the entire contents of which are incorporated herein by reference.

FIELD

The embodiments discussed herein relate to an electronic apparatus and a manufacturing method thereof.

BACKGROUND

Waveguides have conventionally been used for signal transmission in electronic devices. For example, there has been proposed a semiconductor device including a semiconductor chip and a waveguide that is formed thereabove or therebelow. This waveguide includes a transmitting antenna and a receiving antenna that are electrically connected to the semiconductor chip and that are not in contact with the waveguide.

See, for example, Japanese Laid-open Patent Publication No. 2008-148041.

Waveguides enable signal transmission with lower loss than planar transmission lines. However, these waveguides having conventional structures are large in size. Namely, it is difficult to manufacture small electronic devices including waveguides.

SUMMARY

According to an aspect, there is provided an electronic apparatus including: a substrate which includes a terminal; a waveguide which includes a lower conductor that is formed above the substrate and that has an opening at a position corresponding to the terminal and which includes an upper conductor that is arranged above the lower conductor; and a columnar conductor which is formed above the terminal, which penetrates the opening without contacting the lower conductor, and which is connected to the upper conductor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, a waveguide as one mode will be described.

Figure 1A:
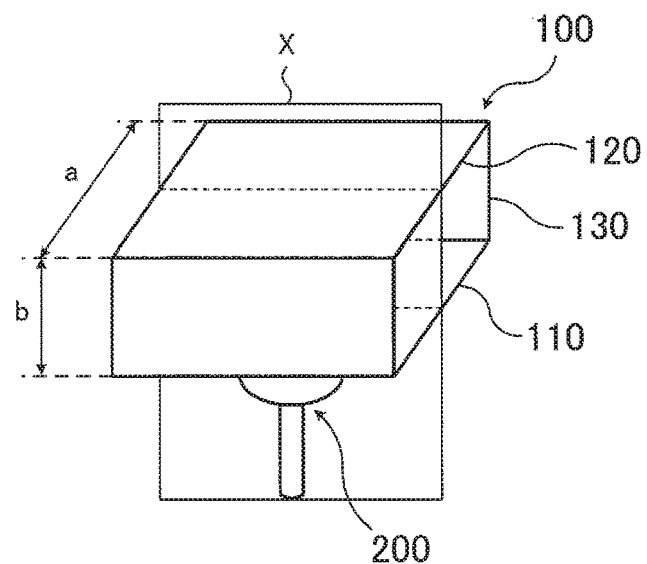
FIGS. 1A and 1B illustrate a related art waveguide as one mode.
Figure 1B:
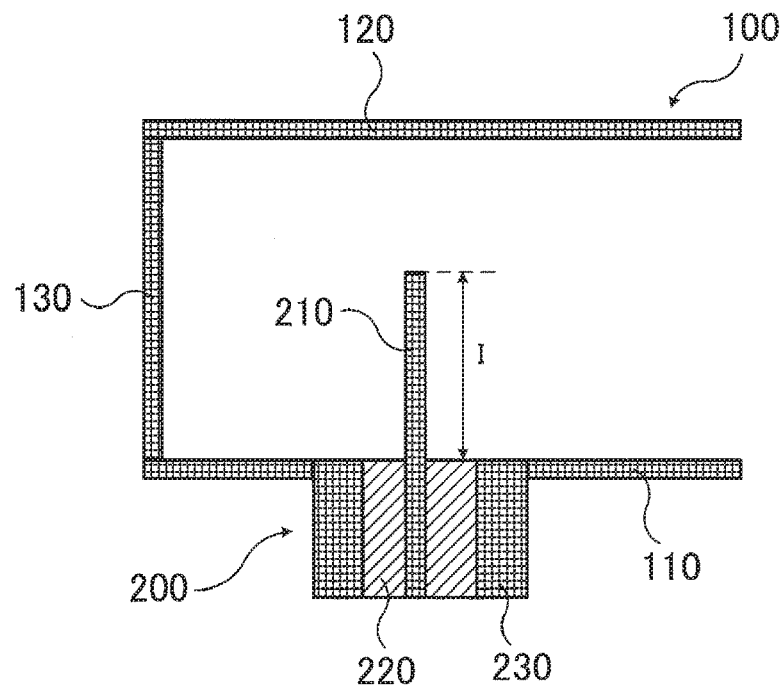

FIGS. 1A and 1B illustrate a waveguide as one mode. FIG. 1A is a schematic perspective view of a main portion of a waveguide as one mode. FIG. 1B is a schematic sectional view taken along a plane X in FIG. 1A.

A waveguide 100 illustrated in FIGS. 1A and 1B includes a lower conductor 110, an upper conductor 120, and a sidewall conductor 130. The upper conductor 120 is formed opposite the lower conductor 110, and the lower conductor 110 and the upper conductor 120 are connected by the sidewall conductor 130. For example, the inside of the waveguide 100 is hollow.

The waveguide 100 is mounted on a device (an electronic apparatus) such as a semiconductor chip or a semiconductor device including a semiconductor chip and is connected to a signal line extended from the device. For example, the waveguide 100 is connected to a signal line (a coaxial signal line) 200 having a coaxial structure as illustrated in FIGS. 1A and 1B.

The coaxial signal line 200 includes a center conductor 210, an insulating material 220 formed around the center conductor 210, and a coated conductor 230 formed around the insulating material 220. By connecting this coaxial signal line 200 to the waveguide 100, signal transmission (mode conversion) is performed between the coaxial signal line 200 and the waveguide 100. To convert a signal transmitted, the coaxial signal line 200 is connected to the waveguide 100 in such a manner that a portion of the center conductor 210 is exposed inside the waveguide 100 without contacting the waveguide 100. For example, the portion of the center conductor 210 exposed inside the waveguide 100 has a length l approximately one fourth of the wavelength of a transmission signal.

The waveguide 100 has a width a set on the basis of the frequency of the transmission signal. In many cases, the waveguide 100 has a thickness approximately half of the width a as a standard setting.

The hollow waveguide 100 enables transmission of a high-frequency signal over a millimeter-wave signal with low loss.

However, as in the waveguide 100, when the center conductor 210 of the coaxial signal line 200 has a portion exposed inside the waveguide 100 for the length of approximately one fourth of the wavelength of the transmission signal, the size (thickness) of the waveguide 100 is increased. Consequently, a module including the waveguide 100 could be increased in size.

Figure 2A:
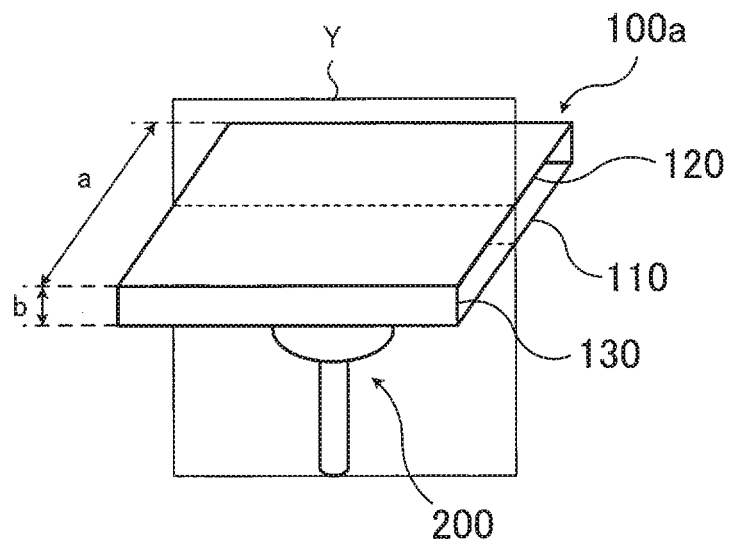
FIGS. 2A and 2B illustrate a related art waveguide as another mode.
Figure 2B:
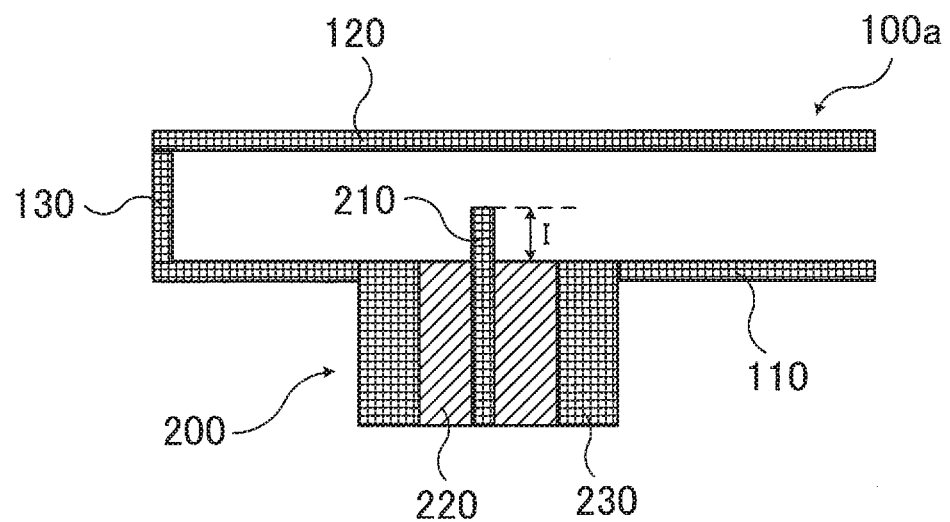

FIGS. 2A and 2B illustrate a waveguide as another mode. FIG. 2A is a schematic perspective view of a main portion of a waveguide as another mode. FIG. 2B is a schematic sectional view taken along a plane Y in FIG. 2A.

FIGS. 2A and 2B illustrate an example of a waveguide 100a that is thinner than the waveguide 100 illustrated in FIGS. 1A and 1B. Compared with the waveguide 100, the waveguide 100a has a smaller thickness between a lower conductor 110 and an upper conductor 120. In addition, while a center conductor 210 of a coaxial signal line 200 has a portion exposed inside the waveguide 100a, this portion has a smaller length l.

It is possible to manufacture a smaller module by using this thin waveguide 100a. However, as a result of reducing the thickness, if the length l of the portion of the center conductor 210 exposed inside the waveguide 100a falls short of one fourth of the wavelength of a transmission signal, sufficient impedance matching is not achieved. As a result, good signal transmission may not be performed between the coaxial signal line 200 and the waveguide 100a.

In view of the above points, a waveguide that enables low-loss signal transmission and achieves downsizing of a module will hereinafter be described. In addition, an electronic apparatus that includes such a waveguide will also be described.

Next, a waveguide and an electronic apparatus including the waveguide according to an embodiment will be described in detail.

Figure 3A:
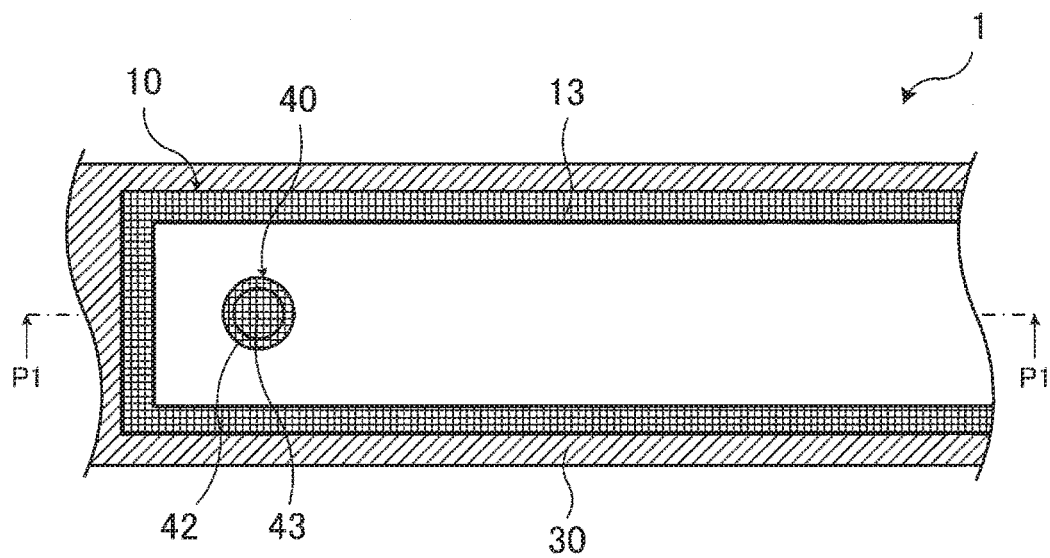
FIGS. 3A and 3B illustrate an electronic apparatus according to an embodiment.
Figure 3B:
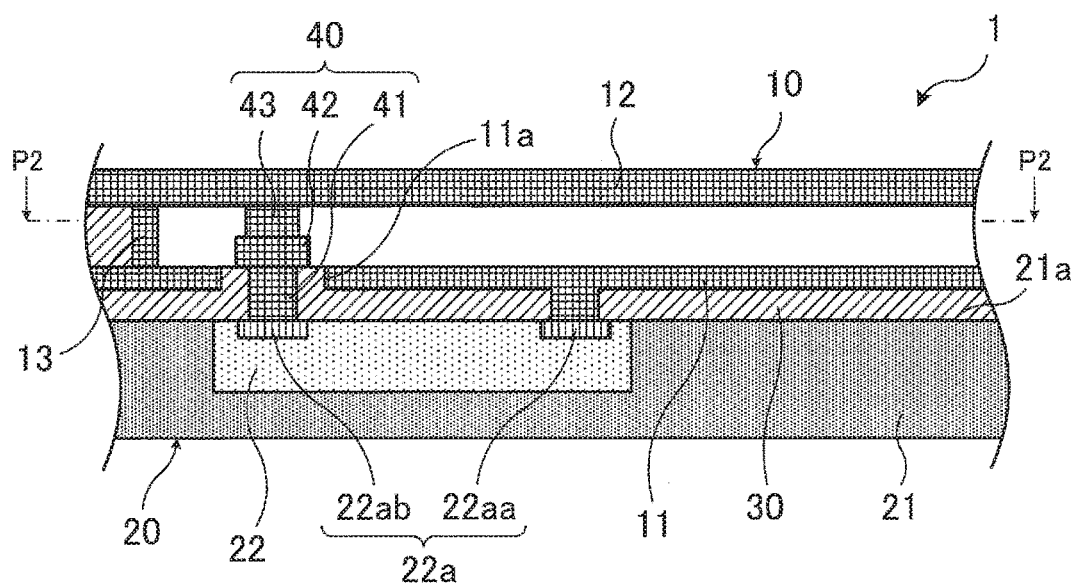

FIGS. 3A and 3B illustrate an electronic apparatus according to an embodiment. FIG. 3A is a schematic plan view of a main portion of an electronic apparatus according to an embodiment. FIG. 3B is a schematic sectional view of the main portion of the electronic apparatus according to the embodiment. FIG. 3A is a schematic plan view taken along line P2-P2 in FIG. 3B. FIG. 3B is a schematic sectional view taken along line P1-P1 in FIG. 3A.

An electronic apparatus 1 illustrated in FIGS. 3A and 3B includes a substrate 20 and a waveguide 10.

The waveguide 10 includes a lower conductor 11, an upper conductor 12, and a sidewall conductor 13. The upper conductor 12 is formed opposite the lower conductor 11, and the lower conductor 11 and the upper conductor 12 are connected by the sidewall conductor 13. The inside of the waveguide 10 is hollow. An insulating layer 30 is formed on the outside of the waveguide 10.

The waveguide 10 is formed above the substrate 20. FIGS. 3A and 3B illustrate a pseudo SoC (System on Chip) substrate as an example of the substrate 20. The substrate 20 may be a wafer that has not been divided yet into chips by dicing or may be a chip obtained by dividing a wafer by dicing. The substrate 20 includes a resin layer 21 and a semiconductor chip 22 embedded in the resin layer 21. The semiconductor chip 22 has a plurality of terminals 22a. FIG. 3B illustrates a ground (GND) terminal 22aa and a signal terminal 22ab as examples of the terminals 22a.

The semiconductor chip 22 is embedded in the resin layer 21 in such a manner that the GND terminal 22aa and the signal terminal 22ab (the terminals 22a) are exposed on a surface 21a of the resin layer 21.

In addition to the semiconductor chip 22, other semiconductor chips and chip components such as chip capacitors may be embedded in the resin layer 21 of the substrate 20.

In addition, while the waveguide 10 is formed on such a pseudo SoC substrate that includes the resin layer 21 and the semiconductor chip 22 as the substrate 20, the waveguide 10 may alternatively be formed on a semiconductor chip, an interposer, a circuit board, or the like. In this embodiment, for convenience of description, the pseudo SoC substrate as illustrated in FIG. 3B is used as an example of the substrate 20.

The lower conductor 11 of the waveguide 10 is formed above the substrate 20 via the insulating layer 30 and is electrically connected to the GND terminal 22aa of the semiconductor chip 22 in the substrate 20. The lower conductor 11 has an opening 11a at a position corresponding to the signal terminal 22ab of the semiconductor chip 22. A conductor pin (a columnar conductor) 40 is formed on the signal terminal 22ab corresponding to the opening 11a. The conductor pin 40 extends from the signal terminal 22ab to the upper conductor 12 through the opening 11a of the lower conductor 11. The top end of the conductor pin 40 reaches the upper conductor 12.

The conductor pin 40 includes a lower-layer pin 41 formed on the signal terminal 22ab, a middle-layer pin 42 formed on the pin 41, and an upper-layer pin 43 formed on the pin 42 and connected (short-circuited) to the upper conductor 12. In the example in FIG. 3B, the pin 41 is formed with a height from the signal terminal 22ab to the top surface of the lower conductor 11 (of the opening 11a), and the pins 42 and 43 are each formed with a height half of the height from the top surface of the lower conductor 11 to the bottom surface of the upper conductor 12. The diameter (the cross-sectional width in the planar direction) of each of the pins 41 to 43 of the conductor pin 40 may be set to a desired value. In the example in FIGS. 3A and 3B, the diameter of the pin 42 is larger than that of the pin 41, and the diameter of the pin 43 is smaller than that of the pin 42.

Each of the pins 41 to 43 of the conductor pin 40 may have an arbitrary cross-sectional shape in the planar direction. For example, other than a circular shape, the cross-sectional shape may be nearly circular, elliptical, nearly elliptical, rectangular, or nearly rectangular.

In addition, while the three pins 41 to 43 of the conductor pin 40 connect the signal terminal 22ab of the semiconductor chip 22 with the upper conductor 12 of the waveguide 10, the number of pins is not limited to three. The number of pin layers may be set to one or more. In the example in FIGS. 3A and 3B, for convenience of description, the number of pin layers of the conductor pin 40 is set to three.

In the electronic apparatus 1, signal transmission (mode conversion) is performed between the waveguide 10 and the substrate 20 (the signal terminal 22ab of the semiconductor chip 22). For example, the distance from the lower conductor 11 to the upper conductor 12 of the waveguide 10, namely, the thickness (height) of the waveguide 10, is equal to or less than one fourth of the wavelength of a signal transmitted between the semiconductor chip 22 and the waveguide 10. The impedance of the semiconductor chip 22 and the impedance of the waveguide 10 are adjusted (matched) by changing the diameters of the pins 41 to 43 of the conductor pin 40.

FIGS. 4A to 4C and 5A to 5C illustrate analysis examples of transmission characteristics of electronic apparatuses.

Figure 4A:
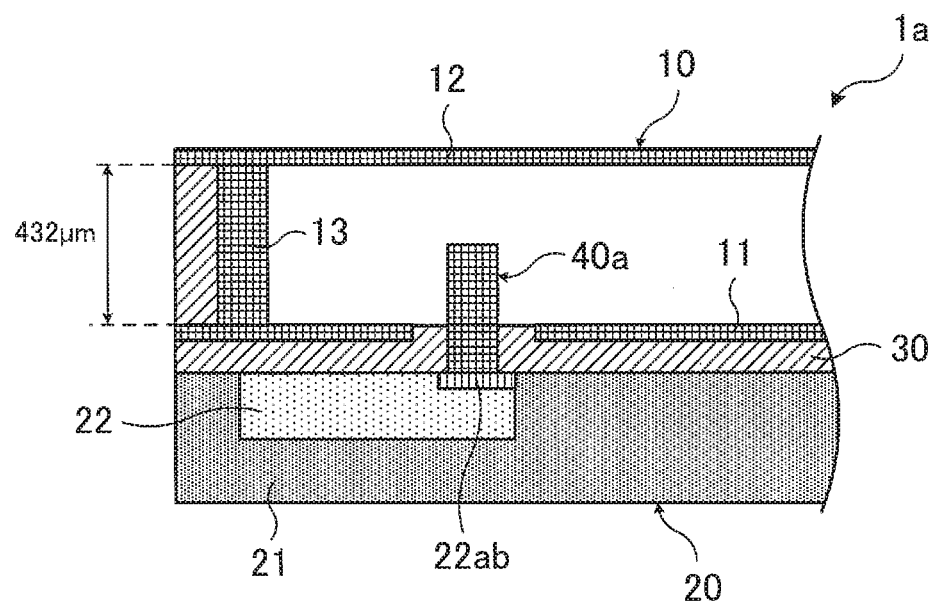
FIGS. 4A to 4C illustrate an analysis example of transmission characteristics of an electronic apparatus (part 1)
Figure 4B:
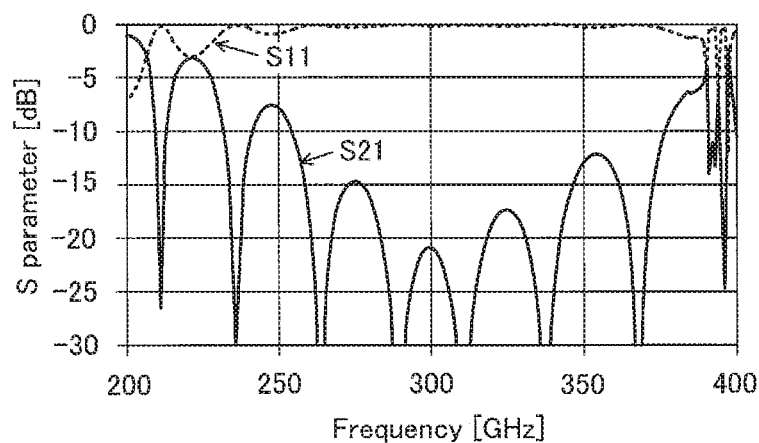
Figure 4C:
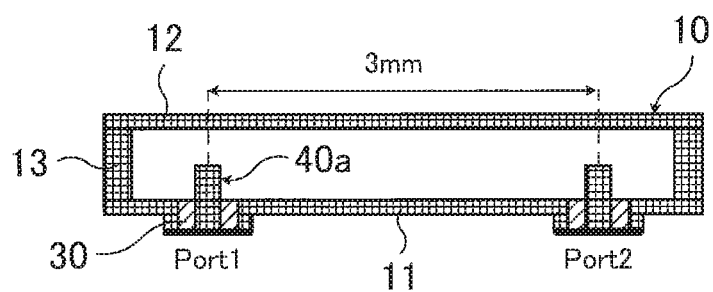

FIGS. 4A to 4C illustrate an analysis example of an electronic apparatus 1a (an electronic apparatus in which the waveguide 100 in FIGS. 1A and 1B is formed). In this electronic apparatus 1a, a conductor pin 40a formed on a signal terminal 22ab of a semiconductor chip 22 is not connected (short-circuited) to an upper conductor 12 of a waveguide 10. FIG. 4A is a schematic sectional view of a main portion of the electronic apparatus 1a. In the electronic apparatus 1a illustrated in FIG. 4A, the waveguide 10 has a thickness (the distance between a lower conductor 11 and the upper conductor 12) of 432 μm. FIG. 4B illustrates examples of results of electromagnetic field analysis of the electronic apparatus 1a. FIG. 4B illustrates an example of a relationship between the frequency [GHz] and S parameters [dB] obtained from the electromagnetic field analysis. In this electromagnetic field analysis, as illustrated in FIG. 4C, the distance between two conductor pins 40a formed on two ports (ports 1 and 2) of the waveguide 10 is set to 3 mm. S11 is used for evaluating reflection characteristics, and S21 is used for evaluating transmission characteristics.

Figure 5A:
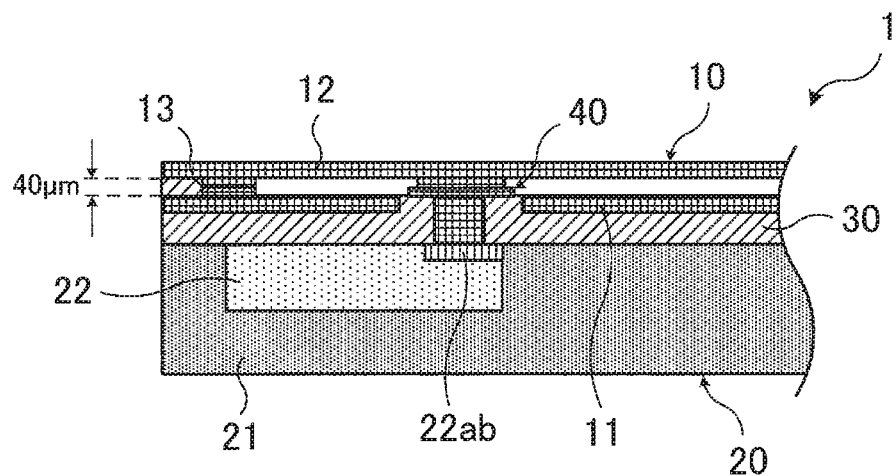
FIGS. 5A to 5C illustrate an analysis example of transmission characteristics of an electronic apparatus (part 2)
Figure 5B:
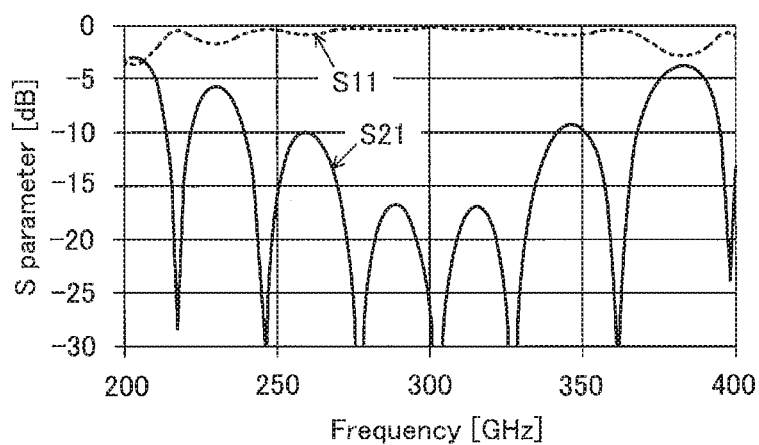
Figure 5C:
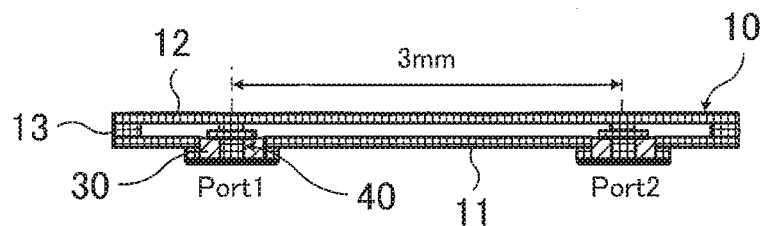

FIGS. 5A to 5C illustrate an analysis example of the electronic apparatus 1 in FIGS. 3A and 3B. In this electronic apparatus 1, the conductor pin 40 formed on the signal terminal 22ab of the semiconductor chip 22 is connected (short-circuited) to the upper conductor 12 of the waveguide 10. FIG. 5A is a schematic sectional view of a main portion of the electronic apparatus 1. In the electronic apparatus 1 illustrated in FIG. 5A, the waveguide 10 has a thickness (the distance between the lower conductor 11 and the upper conductor 12) of 40 μm. FIG. 5B illustrates examples of results of electromagnetic field analysis of the electronic apparatus 1. FIG. 5B illustrates an example of a relationship between the frequency [GHz] and S parameters [dB] obtained from the electromagnetic field analysis. In this electromagnetic field analysis, as illustrated in FIG. 5C, the distance between two conductor pins 40 formed on two ports (ports 1 and 2) of the waveguide 10 is set to 3 mm. S11 is used for evaluating reflection characteristics of a transmission signal, and S21 is used for evaluating transmission characteristics of the transmission signal.

Each S parameter (S11 and S21) in FIGS. 4B and 5B is calculated in dB as the logarithm of an absolute value |S|. The same applies to FIGS. 7A, 7B, and 12.

As described above, the thickness of the waveguide 10 in the electronic apparatus 1 (FIG. 5A) in which the conductor pin 40 on the signal terminal 22ab is short-circuited to the waveguide 10 is approximately one tenth of that of the waveguide 10 in the electronic apparatus 1a (FIG. 4A) in which the conductor pin 40a is not short-circuited to the waveguide 10. FIGS. 4B and 5B indicate that the transmission loss of the electronic apparatus 1 (FIG. 5A) in which the conductor pin 40 is short-circuited to the waveguide 10 is equivalent to that of the electronic apparatus 1a (FIG. 4A) in which the conductor pin 40a is not short-circuited to the waveguide 10. Namely, the electronic apparatus 1 has the waveguide 10 having a thickness approximately one tenth of that of the waveguide 10 of the electronic apparatus 1a while achieving a transmission loss equivalent to that of the electronic apparatus 1a.

FIGS. 6A to 7B illustrate analysis examples of transmission characteristics of waveguide conversion portions.

Figure 6A:
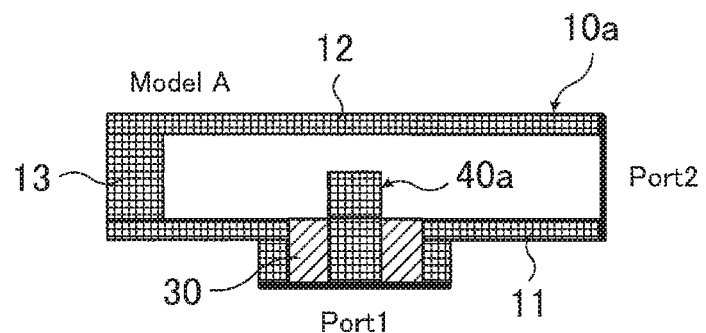
FIGS. 6A to 6C illustrate analysis examples of transmission characteristics of waveguide conversion portions (part 1)
Figure 6B:
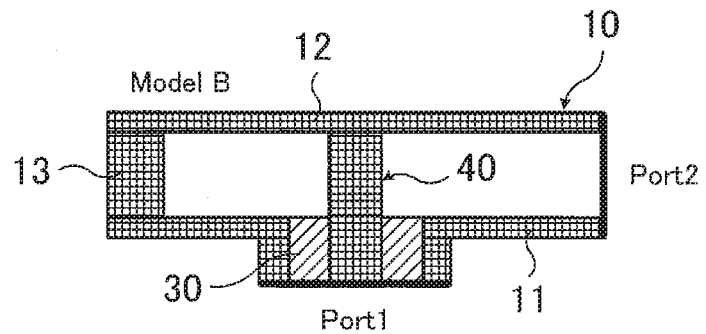
Figure 6C:
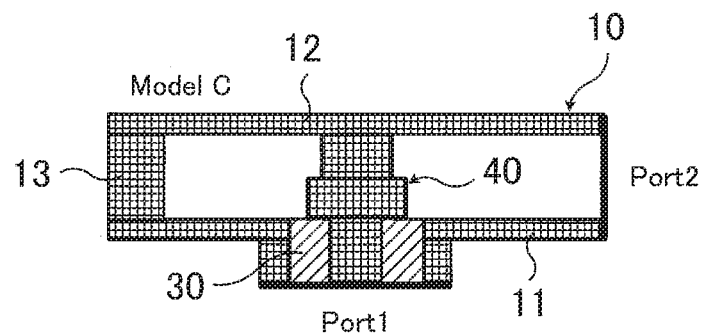

FIGS. 6A to 6C illustrate models of conversion portions of waveguides 10 having conductor pins in different shapes. FIG. 6A illustrates Model A that corresponds to the waveguide 100 in FIGS. 1A and 1B. Namely, in Model A, a conductor pin 40a is not short-circuited to the waveguide 10. In contrast, FIGS. 6B and 6C illustrate models in which a conductor pin 40 is short-circuited to the waveguide 10. FIG. 6B illustrates Model B in which the conductor pin 40 having a certain diameter is short-circuited to the waveguide 10. FIG. 6C illustrates Model C in which the conductor pin 40 having components with different diameters is short-circuited to the waveguide 10.

Figure 7A:
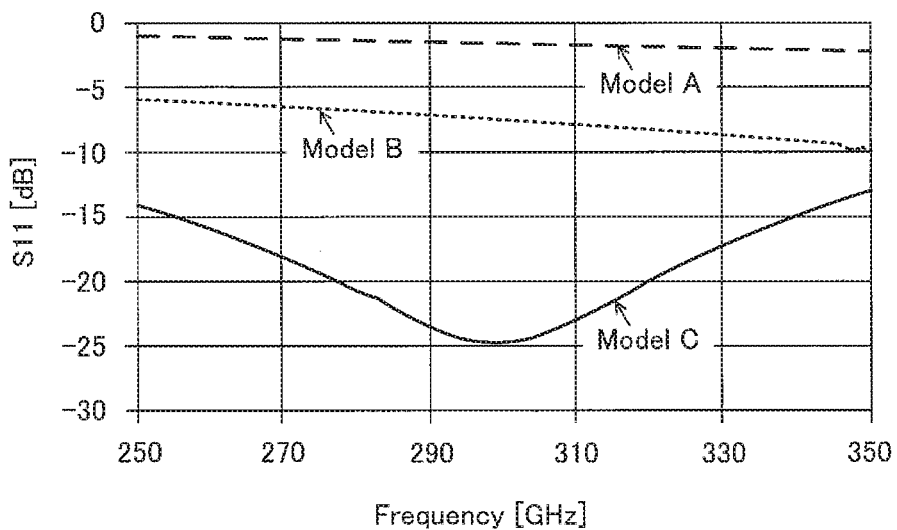
FIGS. 7A and 7B illustrate analysis examples of transmission characteristics of waveguide conversion portions (part 2)
Figure 7B:
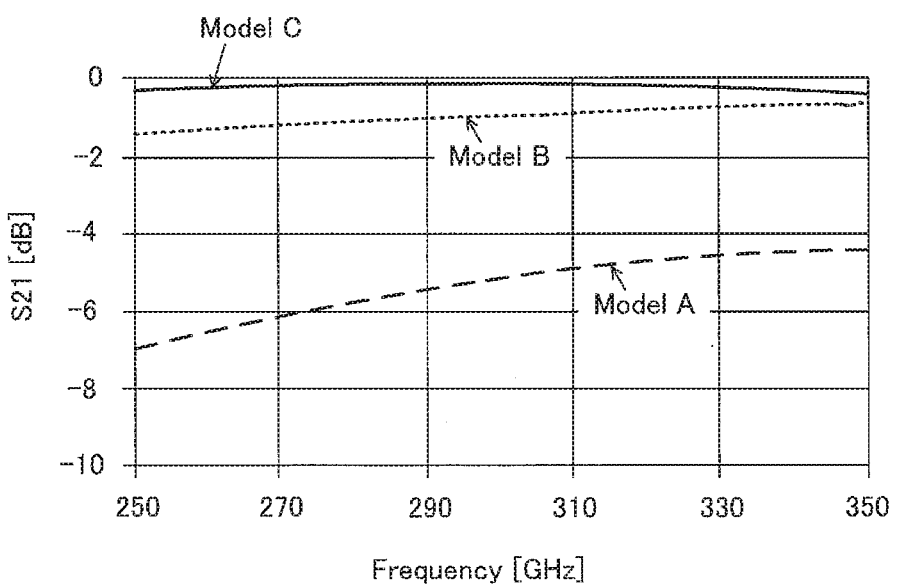

FIGS. 7A and 7B illustrate examples of relationships between the frequency and S parameters obtained from electromagnetic field analysis of input and output ports (ports 1 and 2) of the conversion portions of Models A to C illustrated in FIGS. 6A to 6C. FIG. 7A illustrates an example of a relationship between the frequency [GHz] and S11 [dB] per model. FIG. 7B illustrates an example of a relationship between the frequency [GHz] and S21 [dB] per model. S11 is used for evaluating reflection characteristics of a transmission signal, and S21 is used for evaluating transmission characteristics of the transmission signal.

FIGS. 7A and 7B indicate that the values of S11 of the Models B and C, in which the conductor pin 40 is short-circuited to the waveguide 10, are lower than that of the Model A, in which the conductor pin 40a is not short-circuited to the waveguide 10, and the values of S21 of the Models B and C are higher than that of the Model A. S11 is an index of the reflection characteristics of a transmission signal, and S21 is an index of the transmission characteristics. Namely, the conversion portions of the waveguides 10 of Models B and C represent smaller transmission loss, compared to Model A.

As indicated by Models B and C in FIGS. 7A and 7B, the shape of the conductor pin 40 short-circuited to the waveguide 10 affects the reflection characteristics and the transmission characteristics of a transmission signal. By adjusting the shape of the conductor pin 40, the reflection characteristics and the transmission characteristics at the conversion portion of the waveguide 10 can be adjusted. In addition, by performing such an adjustment, the impedance matching between the waveguide 10 and the signal line (the signal terminal 22ab of the semiconductor chip 22 and the conductor pin 40) can also be performed.

Next, a method for designing the conductor pin 40 and the waveguide 10 will be described with reference to FIGS. 8A to 12.

FIGS. 8A to 12 illustrate a conductor pin designing method according to an embodiment.

Figure 8A:
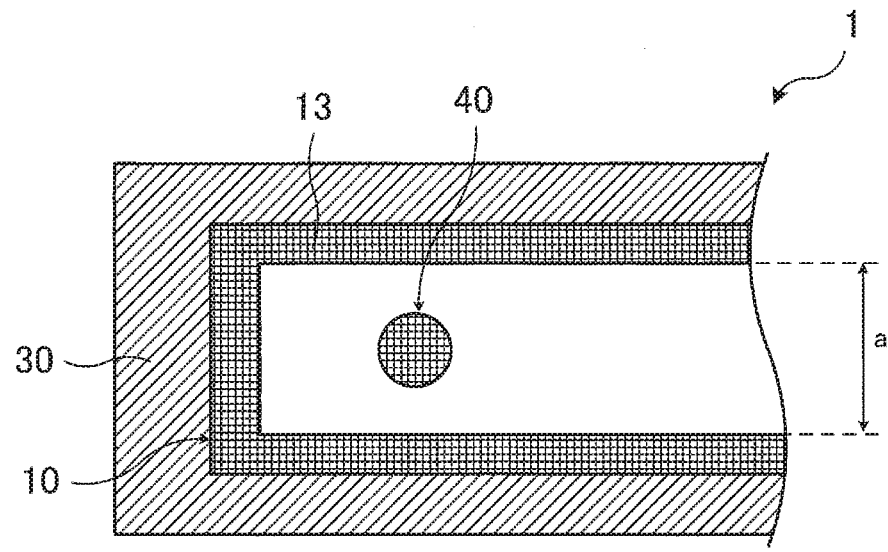
FIGS. 8A and 8B illustrate a conductor pin designing method according to an embodiment (part 1)
Figure 8B:
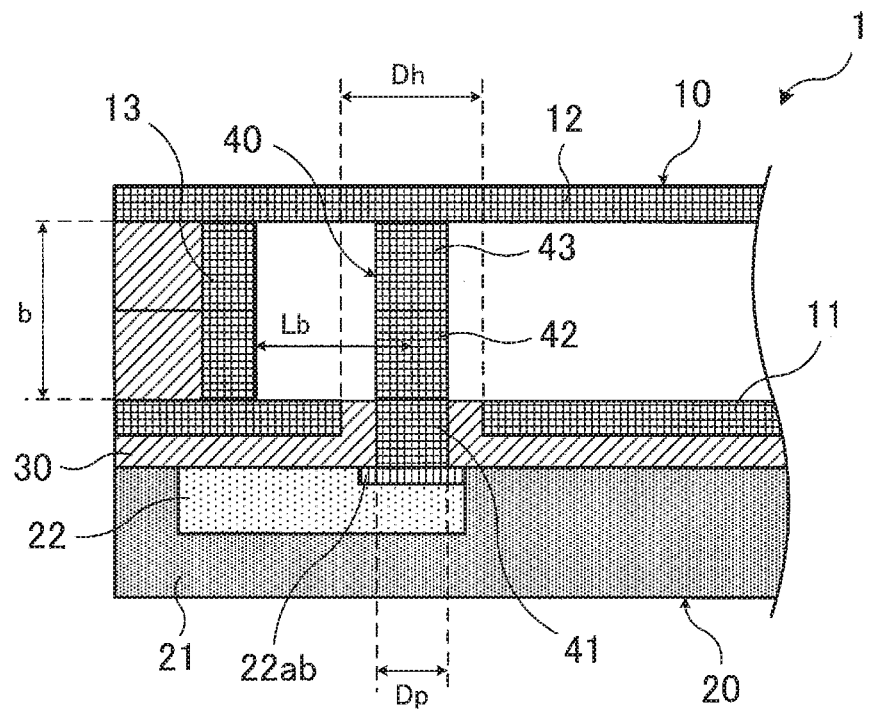

FIGS. 8A and 8B schematically illustrate the electronic apparatus including the conductor pin and the waveguide at an initial design stage. FIG. 8A is a schematic plan view of a main portion of the electronic apparatus. FIG. 8B is a schematic sectional view of the main portion of the electronic apparatus.

First, a diameter Dp of the pin 41, which is formed on the signal terminal 22ab of the semiconductor chip 22, is set to a certain value. For example, the diameter Dp of the pin 41 is set on the basis of the size of the signal terminal 22ab in the planar direction. At an initial design stage, the pins 42 and 43 formed on the pin 41 are also formed to have the diameter Dp.

The opening 11a formed in the lower conductor 11 of the waveguide 10 may be formed to have a size (diameter) Dh so that the characteristic impedance represents a predetermined value, for example, 50Ω, when the pin 41, the insulating layer 30, and the lower conductor 11 are deemed to be a coaxial line having the pin 41 as its center conductor.

The thickness b and the width a of the waveguide 10 may be set to certain values, respectively. However, it is desirable that the thickness b and the width a be set on the basis of the frequency of a signal transmitted. In addition, the distance (a back stub length Lb) from the sidewall conductor 13 to the conductor pin 40 may be set to approximately one fourth of the wavelength of a signal transmitted in the waveguide 10, for example.

As an example, the following description will be made assuming that the waveguide 10 allows a signal having a frequency of 300 GHz to transmit, the diameter Dp of the conductor pin 40 (the pin 41) connected to the waveguide 10 is 100 µm, and the diameter Dh of the opening of the lower conductor 11 is 230 µm. In addition, the following description assumes that the width a, the thickness b, and the back stub length Lb of the waveguide 10 are 864 µm, 40 µm, and 300 µm, respectively.

If the impedance matching is not achieved with the conductor pin 40 at the initial design stage, the diameters of the pins 42 and 43 on the pin 41 are adjusted. However, in this adjustment, the lengths of the pins 41 to 43 are not changed.

Figure 9A:
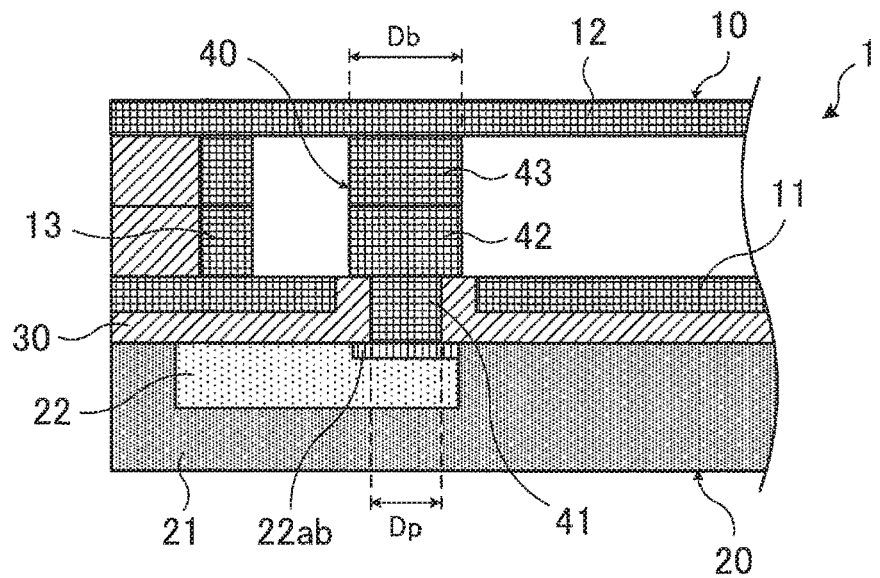
FIGS. 9A and 9B illustrate the conductor pin designing method according to the embodiment (part 2)
Figure 9B:
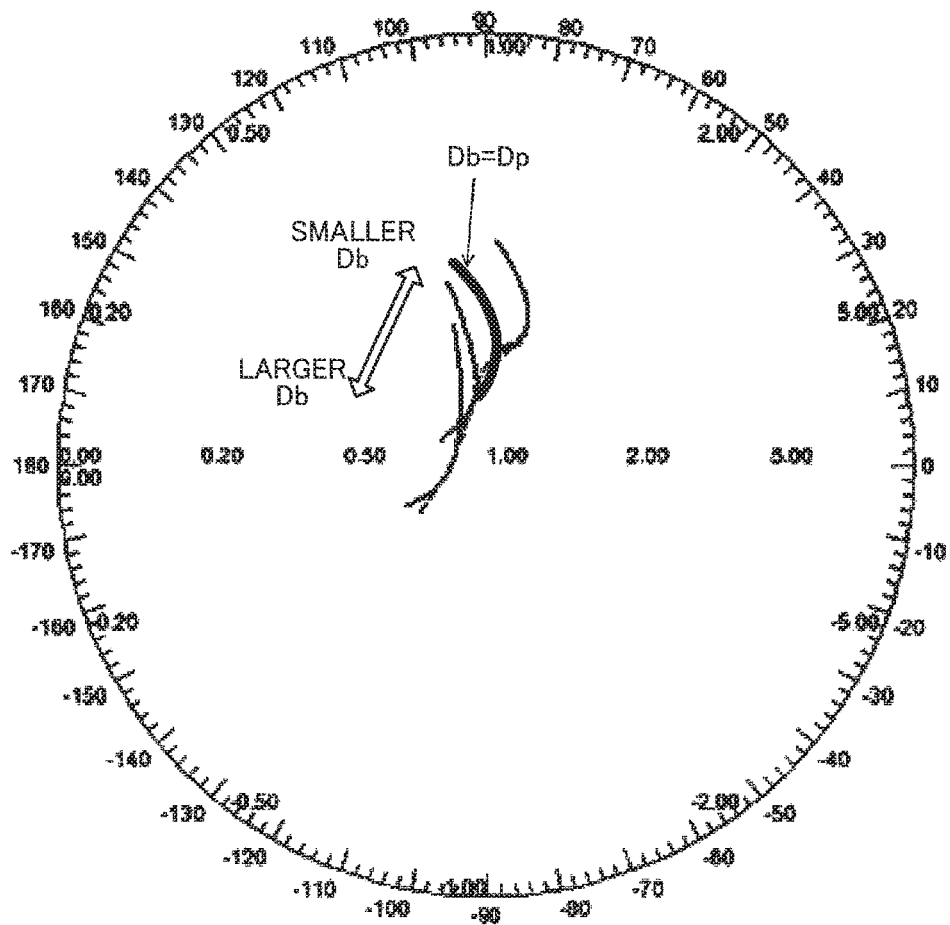

FIGS. 9A and 9B illustrate a first adjustment made to the conductor pin. FIG. 9A is a schematic sectional view of a main portion of an example of the electronic apparatus at a first adjustment stage. FIG. 9B illustrates an example of a Smith chart at the first adjustment stage. The Smith chart in FIG. 9B indicates the input impedance (normalized) seen from the semiconductor chip 22.

For example, as illustrated in FIG. 9A, when the pins 42 and 43 are formed to have a diameter Db larger than the diameter Dp of the pin 41 on the signal terminal 22ab, the distance between the lower conductor 11 of the waveguide 10 and the pin 42 of the conductor pin 40 near the lower conductor 11 is decreased. As a result, the capacitance between the lower conductor 11 and the conductor pin 40 is increased. Thus, as indicated in FIG. 9B, the imaginary part of the input impedance seen from the semiconductor chip 22 tends to shift in the minus direction. Since the resistance value of the conductor pin 40 decreases with the increase of the diameter Db of the pins 42 and 43, the real part of the input impedance also decreases to a certain extent.

When the diameter Db of the pins 42 and 43 is set smaller than the diameter Dp of the pin 41, the imaginary and real parts of the input impedance tend to shift in the opposite direction.

If the impedance matching cannot be achieved by adjusting the diameter Db of the pins 42 and 43, the diameter of the upper pin 43 alone is further adjusted. However, in this adjustment, the lengths of the pins 41 to 43 are not changed.

Figure 10A:
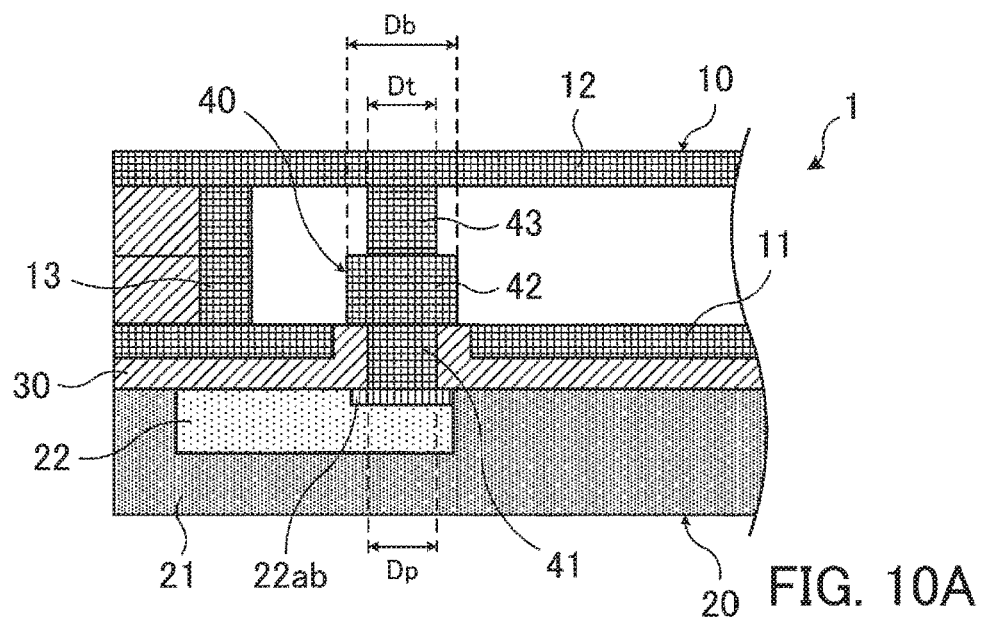
FIGS. 10A and 10B illustrate the conductor pin designing method according to the embodiment (part 3)
Figure 10B:
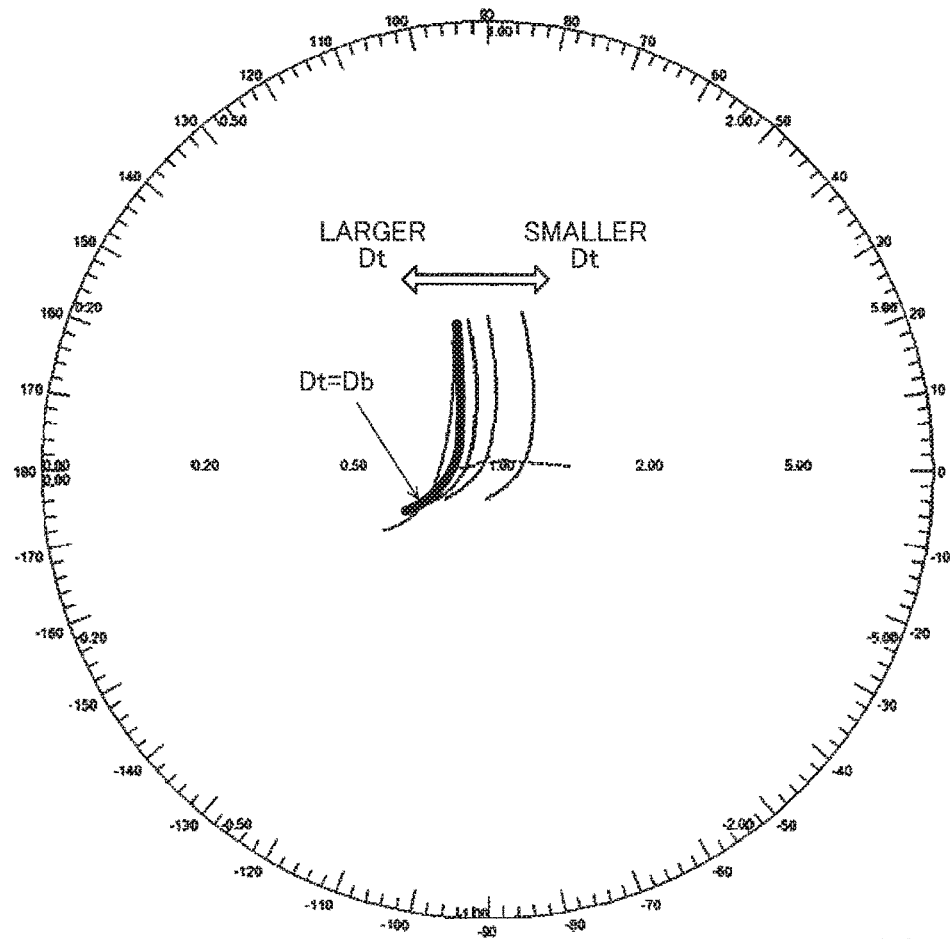

FIGS. 10A and 10B illustrate a second adjustment made to the conductor pin. FIG. 10A is a schematic sectional view of the main portion of the example of the electronic apparatus at a second adjustment stage. FIG. 10B illustrates an example of a Smith chart at the second adjustment stage. The Smith chart in FIG. 10B indicates the input impedance (normalized) seen from the semiconductor chip 22.

For example, as illustrated in FIG. 10A, even when the pin 43 is formed to have a diameter Dt smaller than the diameter Db of the pin 42 immediately under the pin 43, the distance between the lower conductor 11 of the waveguide 10 and the pin 42 of the conductor pin 40 near the lower conductor 11 does not change. Thus, the capacitance between the lower conductor 11 and the conductor pin 40 does not change at all or does not change significantly. When the diameter Dt of the pin 43 is formed to be smaller than the diameter Db of the pin 42 immediately under the pin 43, the resistance value of the conductor pin 40 is increased. As a result, the real part of the input impedance seen from the semiconductor chip 22 tends to increase.

If the diameter Dt of the pin 43 is formed to be larger than the diameter Db of the pin 42 immediately under the pin 43, the resistance value of the conductor pin 40 is decreased. As a result, the real part of the input impedance is decreased. In addition, the capacitance between the pin 43 and the lower conductor 11 is increased, and the imaginary part of the input impedance is also changed to some extent.

Figure 11:
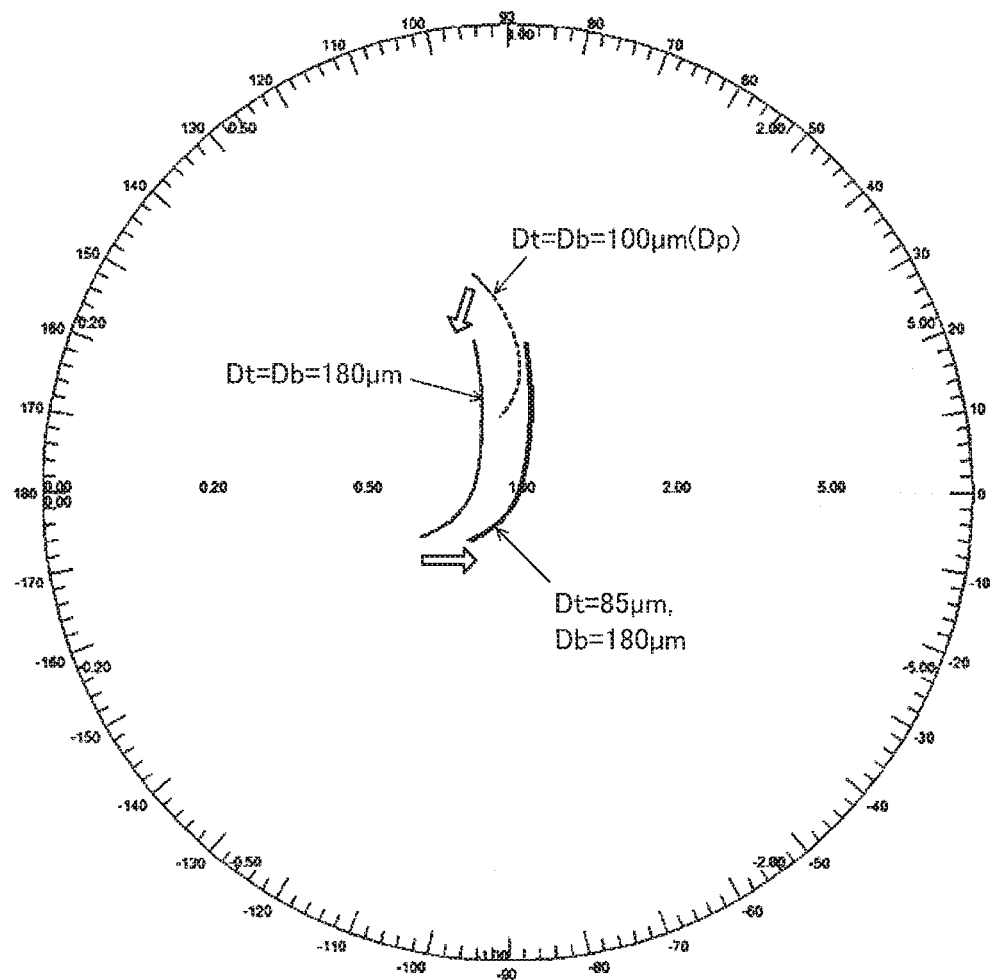
FIG. 11 illustrates the conductor pin designing method according to the embodiment (part 4)
Figure 12:
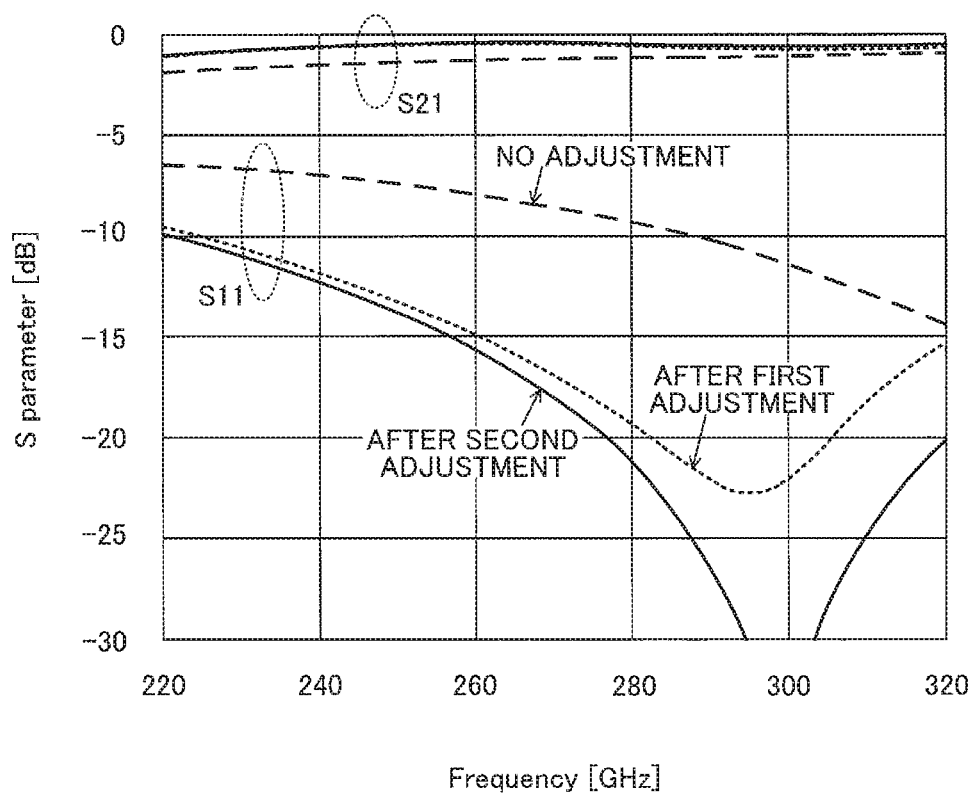
FIG. 12 illustrates the conductor pin designing method according to the embodiment (part 5)

FIGS. 11 and 12 illustrate an example of impedance matching. FIG. 11 is a Smith chart illustrating an example in which impedance matching is achieved by performing the first adjustment described with FIGS. 9A and 9B first, and the second adjustment described with FIGS. 10A and 10B next. FIG. 12 illustrates examples of relationships between the frequency [GHz] and S parameters [dB]. These relationships have been obtained by conducting electromagnetic field analysis before any of the adjustments is performed, after the first adjustment is performed, and after the second adjustment is performed. S11 is used for evaluating reflection characteristics of a transmission signal, and S21 is used for evaluating transmission characteristics of the transmission signal.

For example, the following description will be made assuming that the diameters (Db and Dt) of the pins 42 and 43 of the conductor pin 40 are the same as the diameter Dp of the pin 41 on the signal terminal 22ab at the initial design stage in FIGS. 8A and 8B before any of the adjustments is made. Namely, all of the diameters have been set to 100 µm (Dt=Db=100 µm (Dp)).

In accordance with the example of the first adjustment in FIGS. 9A and 9B, the diameter Db of the pin 43 and the pin 42 on the pin 41 of the conductor pin 40 is adjusted so that the imaginary part of the input impedance reaches 0 or nearly 0 at around the frequency of a transmission signal. In this example, the diameter Db of the pin 43 and the pin 42 on the pin 41 having the diameter Dp of 100 µm is set to 180 µm (Dt=Db=180 µm).

With this adjustment, the capacitance between the lower conductor 11 of the waveguide 10 and the conductor pin 40 is increased. As a result, mainly, the imaginary part of the input impedance reaches 0 or nearly 0 as it shifts in the minus direction.

Next, in accordance with the example of the second adjustment in FIGS. 10A and 10B, the diameter Dt of the upper pin 43 of the conductor pin 40 is adjusted so that the real part of the input impedance reaches 1 or nearly 1. In this example, the diameter Dt of the upper pin 43 is set to 85 µm, which is smaller than the diameter Db (180 µm) of the lower pin 42 (Dt=85 µm, Db=180 µm). With this adjustment, the resistance value of the conductor pin 40 is increased. As a result, mainly, the real part of the input impedance increases and reaches 1 or nearly 1. Namely, the impedance matching is achieved.

In addition, after the above first and second adjustments are performed, a fine diameter adjustment may be made to at least one of the pins 41 to 43 of the conductor pin 40 so that even better impedance matching can be achieved.

As described above, first, the first adjustment is made to the unadjusted conductor pin 40. Next, the second adjustment is made to the adjusted conductor pin 40. In this way, as illustrated in FIG. 12, it is possible to decrease the value of S11, which is as an index of the reflection characteristics of a transmission signal, and increase the value of S21, which is an index of the transmission characteristics. By adjusting the diameters of the pins 41 to 43 formed as the conductor pin 40 as described above, the impedance matching is achieved, and the transmission loss at the conversion portion of the waveguide 10 is reduced.

Next, a forming method of an electronic apparatus including the above waveguide 10 according to an embodiment will be described in detail with reference to FIGS. 13A to 20. Each of FIGS. 13A to 20 is a schematic sectional view of a main portion of an electronic apparatus at each step in the forming method.

The following description will be made based on an example in which a pseudo SoC substrate is used as the substrate 20 and the waveguide 10 is formed by using a so-called rewiring technique for forming wiring layers (rewiring layers) on the pseudo SoC substrate.

Figure 13A:
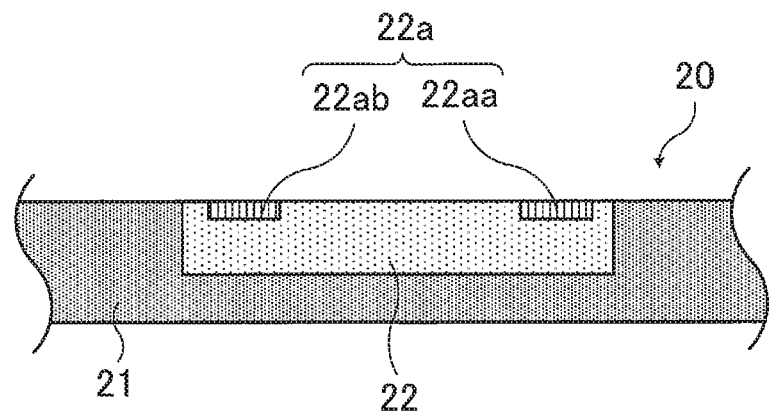
FIGS. 13A to 13C illustrate a forming method of an electronic apparatus including a waveguide according to the embodiment (part 1)

First, as illustrated in FIG. 13A, a substrate 20 (a pseudo SoC substrate) including a resin layer 21 and a semiconductor chip 22 embedded therein is prepared. For example, epoxy resin mixed with silica filler or the like is used as the resin layer 21 of the substrate 20. To form the substrate 20, first, the periphery of the semiconductor chip 22 is covered with the resin layer 21 in such a manner that a side on which terminals 22a (22aa and 22ab) are arranged is exposed. Next, the resin layer 21 is shaped by heating. In addition to the semiconductor chip 22, other semiconductor chips and chip components such as chip capacitors may be embedded in the resin layer 21 of the substrate 20.

For example, a wafer (a pseudo wafer) that has not been divided yet into chips by dicing is used as the substrate 20. Alternatively, a chip obtained by dividing a pseudo wafer by dicing may be used as the substrate 20.

Figure 13B:
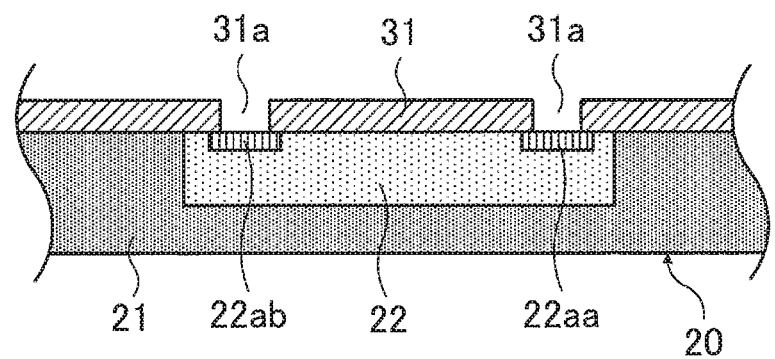

Next, as illustrated in FIG. 13B, an insulating layer 31 (a part of the above insulating layer 30) having openings 31a on the terminals 22a of the semiconductor chip 22 embedded in the substrate 20 is formed. In this step, for example, first, photosensitive phenol resin is applied with a thickness of 10 µm onto the substrate 20. Next, after exposed to light, the photosensitive phenol resin is developed with tetramethylammonium hydroxide (TMAH) or the like. Next, the photosensitive phenol resin is cured at a temperature between 200° C. and 250° C., for example, at 200° C. As a result, the insulating layer 31 having the openings 31a as illustrated in FIG. 13B is formed.

Figure 13C:
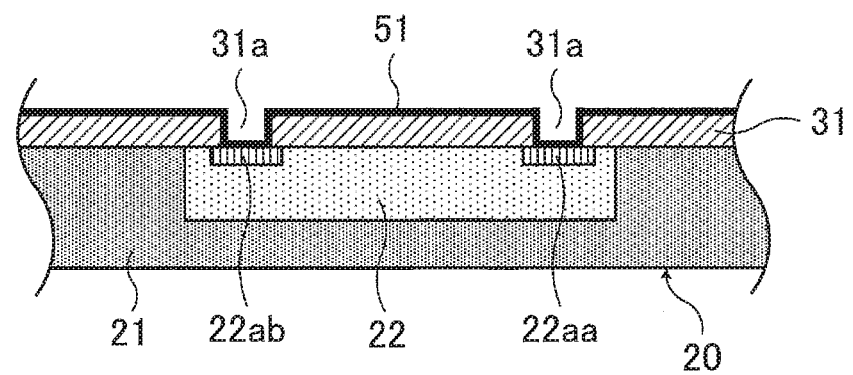

Next, as illustrated in FIG. 13C, a seed layer 51 is formed on the insulating layer 31 including the openings 31a. In this step, for example, the seed layer 51 is formed by forming a titanium (Ti) layer having a thickness of 20 nm on the insulating layer 31 by sputtering and by forming a copper (Cu) layer having a thickness of 100 nm on the Ti layer by sputtering.

Figure 14A:
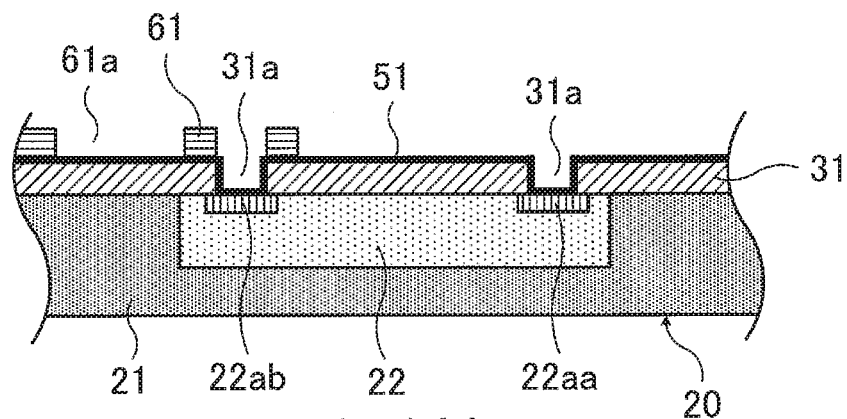
FIGS. 14A to 14C illustrate the forming method of an electronic apparatus including a waveguide according to the embodiment (part 2)

Next, as illustrated in FIG. 14A, a resist pattern 61 having openings 61a is formed on the seed layer 51. The openings 61a correspond to areas where the pin 41 of the conductor pin 40 and the lower conductor 11 of the waveguide 10 are to be formed. In this step, for example, to form the resist pattern 61, resist material is applied with a thickness of 8 µm onto the seed layer 51. Next, after exposed to light, the resist material is developed with TMAH or the like. The resist pattern 61 is formed on areas that separate the pin 41 to be formed on the signal terminal 22ab of the semiconductor chip 22 from the lower conductor 11.

Figure 14B:
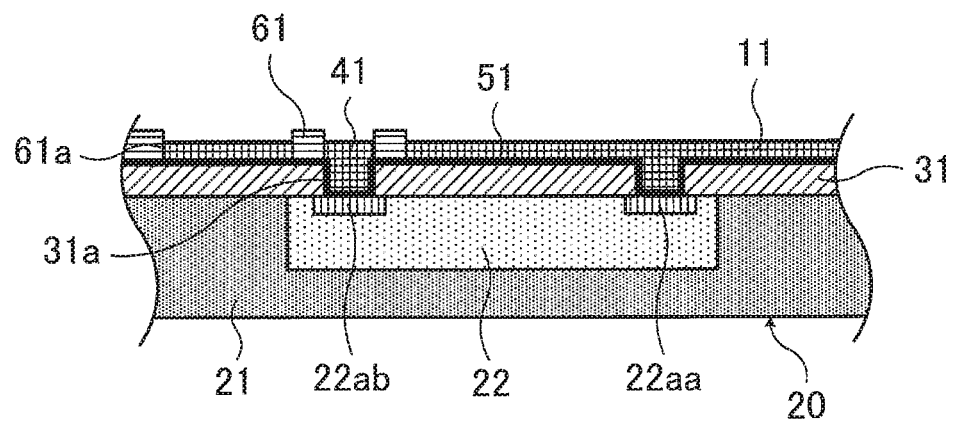

Next, as illustrated in FIG. 14B, the pin 41 at the bottom layer of the conductor pin 40 and the lower conductor 11 of the waveguide 10 are formed in the openings 61a of the resist pattern 61. In this step, for example, the pin 41 and the lower conductor 11 are formed by depositing Cu as the conductor material through electrolytic plating in which the seed layer 51 is used as a power feeding layer. For example, the lower conductor 11 has a height of 5 µm. The lower conductor 11 is connected to the GND terminal 22aa of the semiconductor chip 22. The pin 41 is connected to the signal terminal 22ab of the semiconductor chip 22.

Figure 14C:
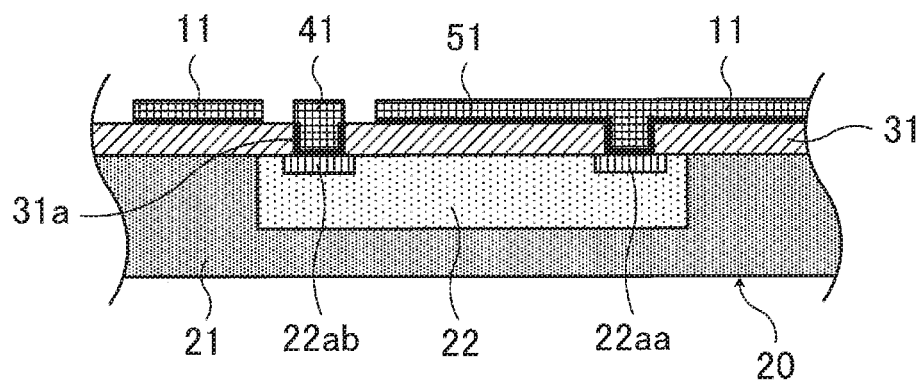

Next, as illustrated in FIG. 14C, the resist pattern 61 and a part of the seed layer 51 are removed. In this step, for example, first, the resist pattern 61 is removed by using acetone or the like. Next, the part of the seed layer 51 exposed as a result of the removal of the resist pattern 61 is removed. When the seed layer 51 has a laminated structure in which the Cu layer is formed on the Ti layer as described above, the Cu layer is selectively removed first, and the Ti layer is selectively removed next. For example, the Cu layer is selectively removed by wet etching in which potassium sulfate ($K_2SO_4$) is used as an etchant. For example, the Ti layer is selectively removed by dry etching in which a mixed gas of carbon tetrafluoride ($CF_4$) and oxygen ($O_2$) is used.

Figure 15A:
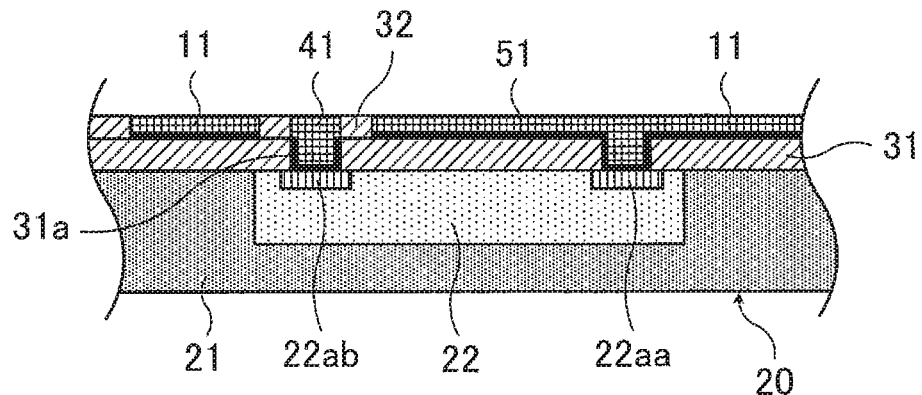
FIGS. 15A to 15C illustrate the forming method of an electronic apparatus including a waveguide according to the embodiment (part 3)

Next, as illustrated in FIG. 15A, an insulating layer 32 (a part of the above insulating layer 30) is formed on the areas from which the resist pattern 61 and the part of the seed layer 51 have been removed. In this step, for example, first, photosensitive phenol resin is applied with a thickness of 5 µm to the areas. Next, after exposed to light, the photosensitive phenol resin is developed with TMAH or the like. Finally, the photosensitive phenol resin is cured at a temperature of 200° C. As a result, the insulating layer 32 as illustrated in FIG. 15A is formed.

Figure 15B:
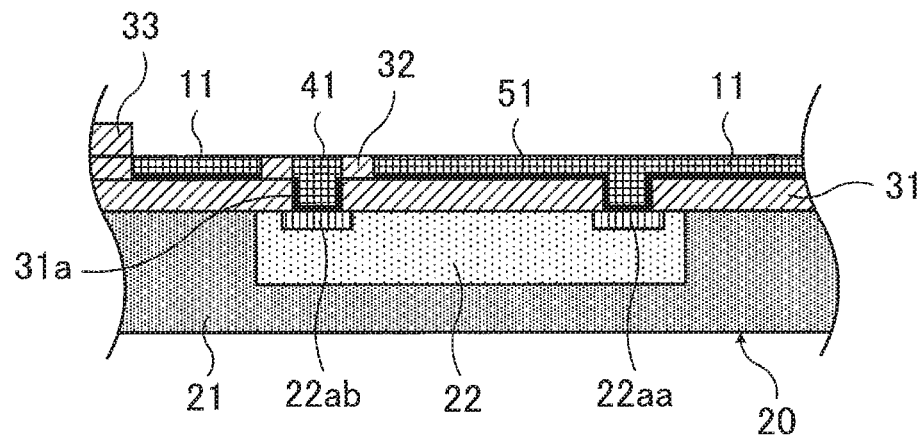

Next, as illustrated in FIG. 15B, an insulating layer 33 (a part of the above insulating layer 30) is formed on an area to be the outside of the waveguide 10 being formed. In this step, for example, first, photosensitive phenol resin is applied with a thickness of 10 µm to the area. Next, after exposed to light, the photosensitive phenol resin is developed with TMAH or the like. Finally, the photosensitive phenol resin is cured at a temperature of 200° C. As a result, the insulating layer 33 as illustrated in FIG. 15B is formed.

Figure 15C:
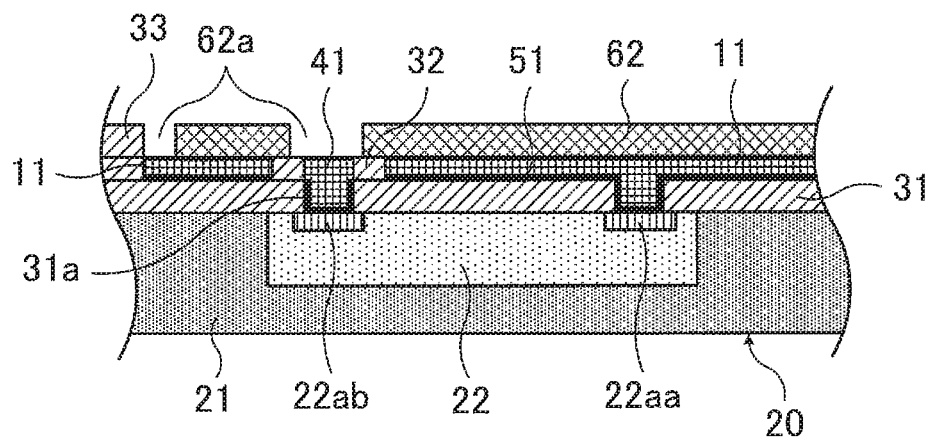

Next, as illustrated in FIG. 15C, a sacrificial layer 62 having openings 62a is formed. The openings 62a correspond to areas where the pin 42 of the conductor pin 40 and the sidewall conductor 13 of the waveguide 10 are to be formed. In this step, for example, to form the sacrificial layer 62, resist material is applied with a thickness of 10 µm. Next, after exposed to light, the resist material is developed with TMAH or the like. Of the openings 62a of the sacrificial layer 62, the diameter of the opening 62a that corresponds to the area where the pin 42 is to be formed is set based on the diameter of the pin 42 to be formed. In the example in FIG. 15C, the opening 62a is formed to have a diameter larger than that of the pin 41 formed on the signal terminal 22ab.

Figure 16A:
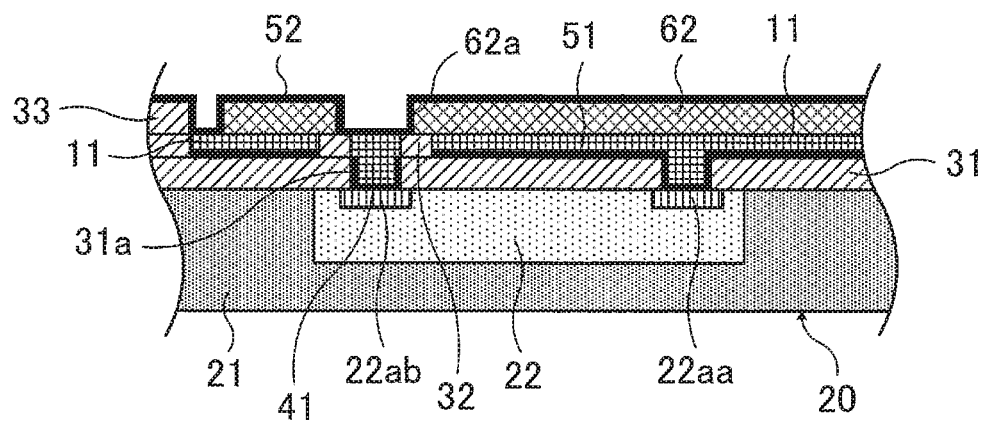
FIGS. 16A to 16C illustrate the forming method of an electronic apparatus including a waveguide according to the embodiment (part 4)

Next, as illustrated in FIG. 16A, a seed layer is formed on the sacrificial layer 62 including the openings 62a. For example, the seed layer 52 is formed by forming a Ti layer and a Cu layer having respective predetermined thicknesses by sputtering.

Figure 16B:
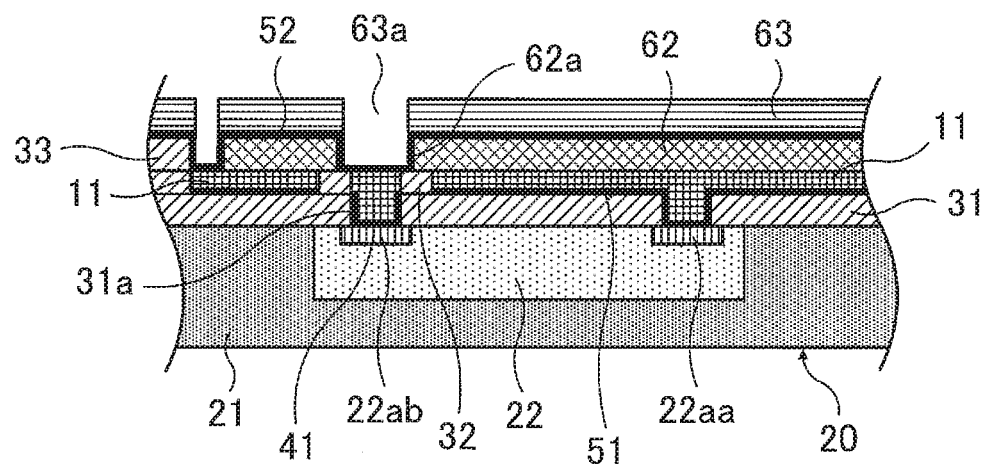

Next, as illustrated in FIG. 16B, a resist pattern 63 having openings 63a is formed on the seed layer 52. The openings 63a correspond to areas where the pin 42 of the conductor pin 40 and the sidewall conductor 13 of the waveguide 10 are to be formed. For example, to form the resist pattern 63, resist material is applied with a thickness of 8 μm onto the seed layer 52. Next, after exposed to light, the resist material is developed with TMAH or the like.

Figure 16C:
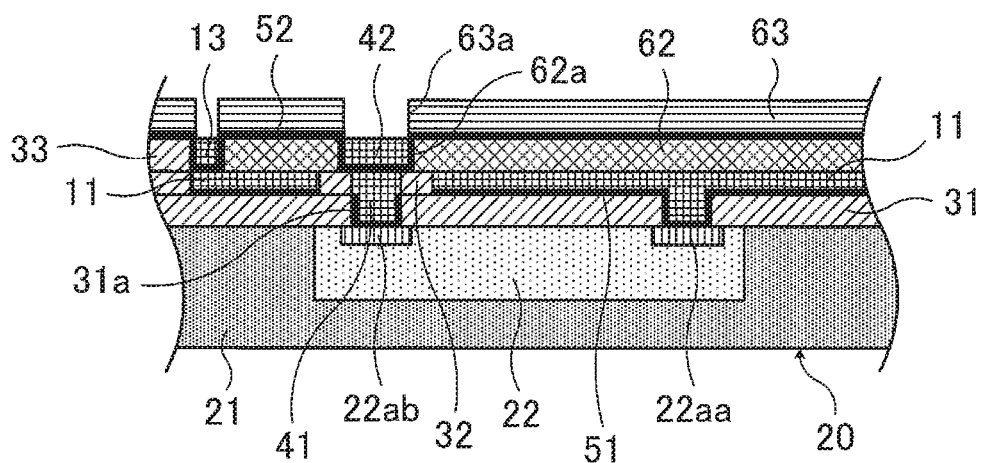

Next, as illustrated in FIG. 16C, the pin 42 (the middle layer) of the conductor pin 40 and the sidewall conductor 13 (the lower layer) of the waveguide 10 are formed in the openings 62a of the sacrificial layer 62 located at the openings 63a of the resist pattern 63. For example, the pin 42 and the sidewall conductor 13 are formed by depositing Cu through electrolytic plating in which the seed layer 52 is used as a power feeding layer. For example, the pin 42 and the sidewall conductor 13 formed in this step have a height of 10 μm.

Figure 17A:
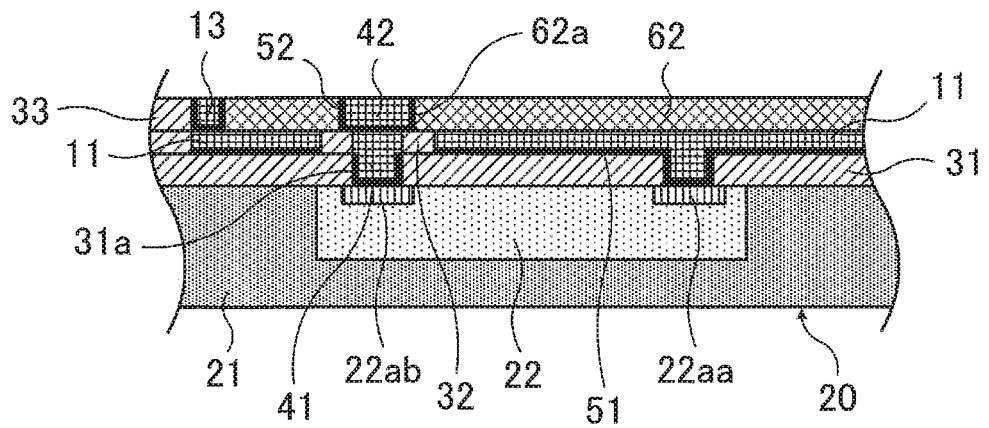
FIGS. 17A to 17C illustrate the forming method of an electronic apparatus including a waveguide according to the embodiment (part 5)

Next, as illustrated in FIG. 17A, the resist pattern 63 and a part of the seed layer 52 are removed. For example, first, the resist pattern 63 is removed by using acetone or the like. Next, the part of the seed layer 52 exposed as a result of the removal of the resist pattern 63 is selectively removed by etching. By removing the seed layer 52, the pin 42 and the sidewall conductor 13 are electrically separated.

Figure 17B:
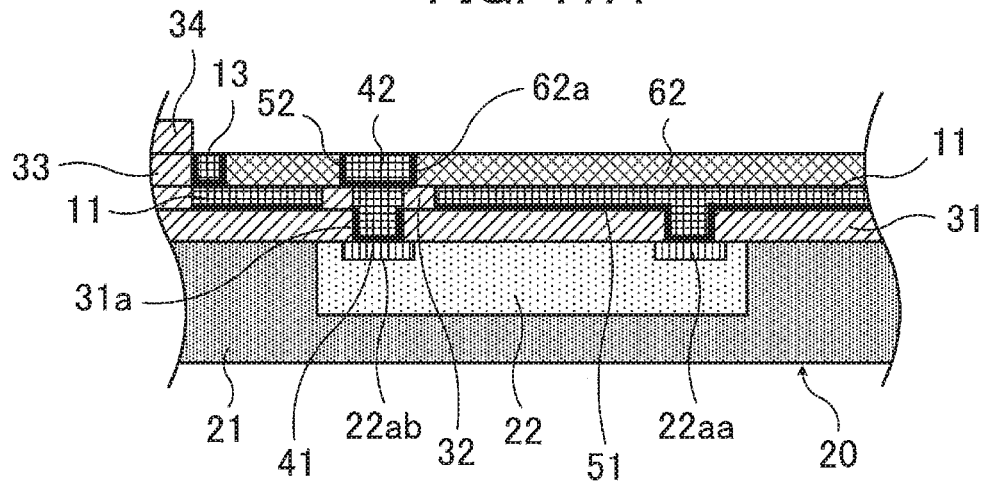

Next, as illustrated in FIG. 17B, an insulating layer 34 (a part of the above insulating layer 30) is formed on an area to be the outside of the waveguide 10 being formed. For example, first, photosensitive phenol resin is applied with a thickness of 10 μm. Next, after exposed to light, the photosensitive phenol resin is developed with TMAH or the like. Finally, the photosensitive phenol resin is cured at a temperature of C. As a result, the insulating layer 34 is formed.

Figure 17C:
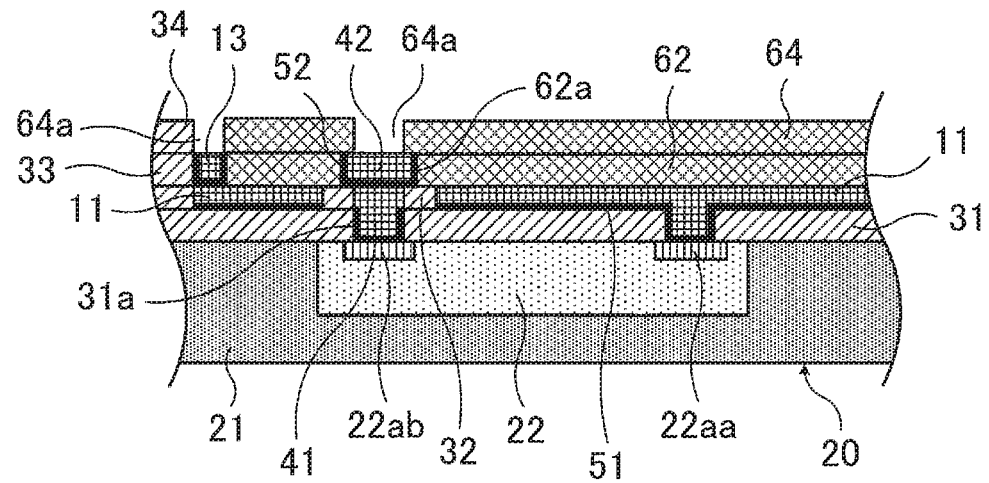

Next, as illustrated in FIG. 17C, a sacrificial layer 64 having openings 64a is formed. The openings 64a correspond to areas where the pin 43 of the conductor pin 40 and the sidewall conductor 13 of the waveguide 10 are to be formed. For example, to form the sacrificial layer 64, resist material is applied with a thickness of 10 μm. Next, after exposed to light, the resist material is developed with TMAH or the like. Of the openings 64a of the sacrificial layer 64, the diameter of the opening 64a that corresponds to the area where the pin 43 is to be formed is set based on the diameter of the pin 43. In the example in FIG. 17C, the diameter of the opening 64a is smaller than that of the pin 42 formed earlier.

Figure 18A:
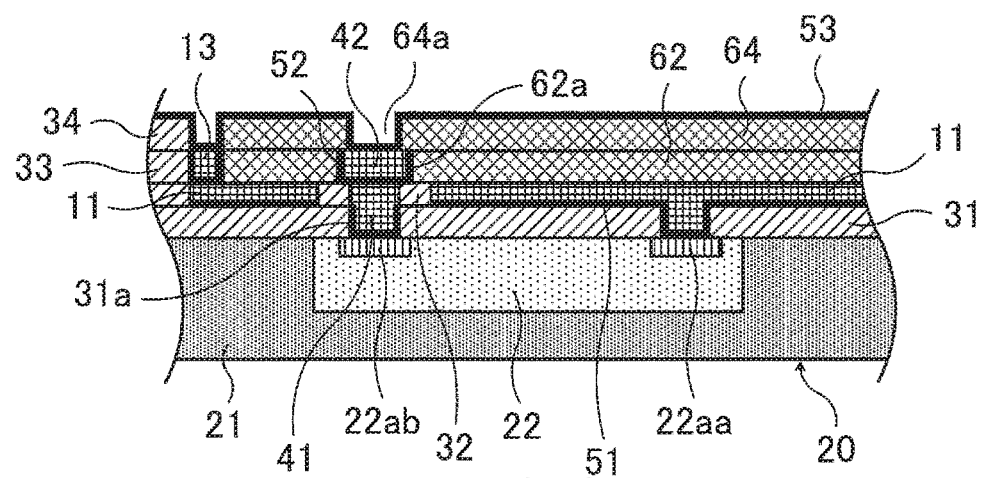
FIGS. 18A to 18C illustrate the forming method of an electronic apparatus including a waveguide according to the embodiment (part 6)

Next, as illustrated in FIG. 18A, a seed layer 53 is formed on the sacrificial layer 64 including the openings 64a. For example, the seed layer 53 is formed by forming a Ti layer and a Cu layer having respective predetermined thicknesses by sputtering.

Figure 18B:
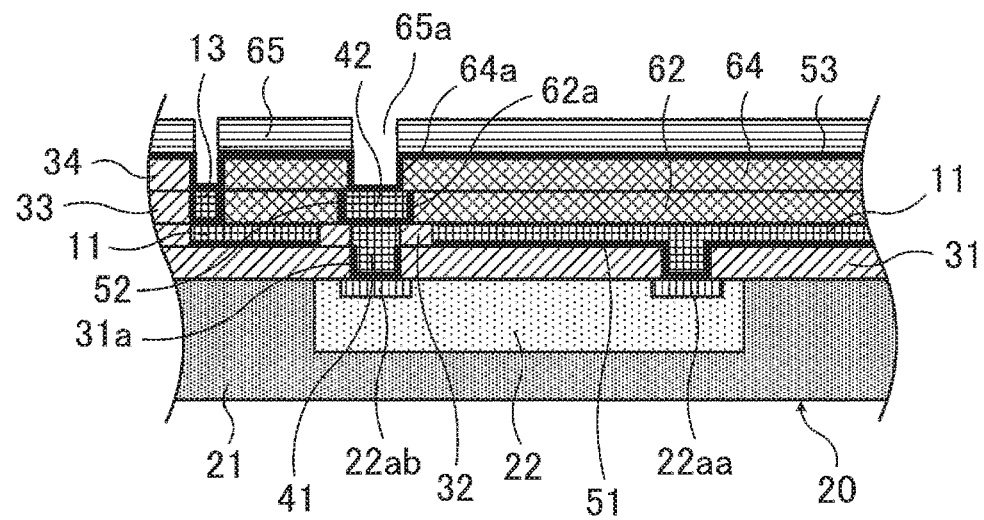

Next, as illustrated in FIG. 18B, a resist pattern 65 having openings 65a is formed on the seed layer 53. The openings 65a correspond to areas where the pin 43 of the conductor pin 40 and the sidewall conductor 13 of the waveguide 10 are to be formed. For example, to form the resist pattern 65, resist material is applied with a thickness of 8 μm onto the seed layer 53. Next, after exposed to light, the resist material is developed with TMAH or the like.

Figure 18C:
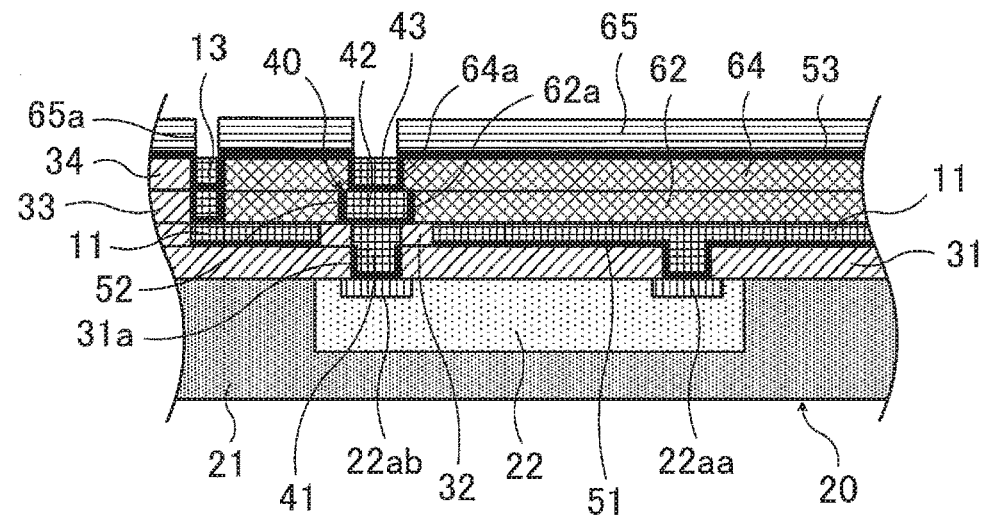

Next, as illustrated in FIG. 18C, the pin 43 (the upper layer) of the conductor pin 40 and the sidewall conductor 13 (the upper layer) of the waveguide 10 are formed in the openings 64a of the sacrificial layer 64 located at the openings 65a of the resist pattern 65. For example, the pin 43 and the sidewall conductor 13 are formed by depositing Cu through electrolytic plating in which the seed layer 53 is used as a power feeding layer. For example, the pin 43 and the sidewall conductor 13 formed in this step have a height of 10 μm. By forming the pin 43 in this way, the conductor pin 40 having three layers of the pins 41 to 43 is formed on the signal terminal 22ab.

Figure 19A:
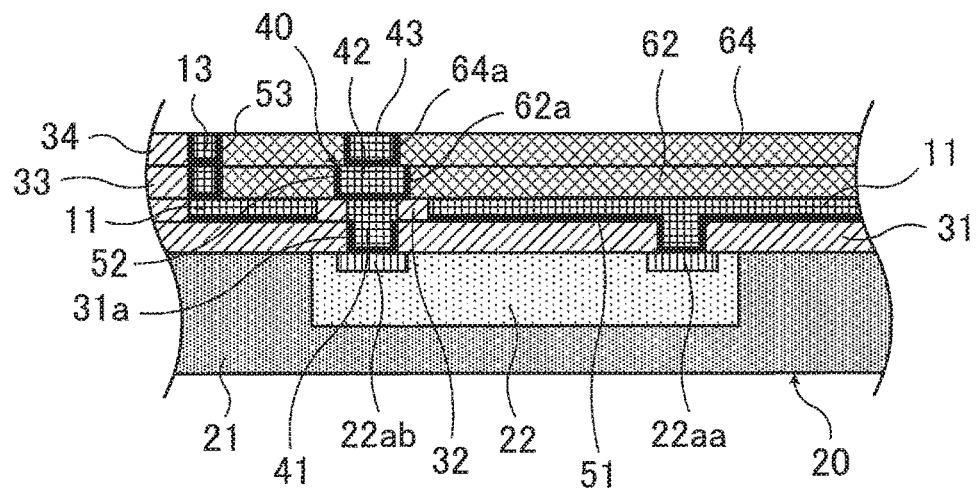
FIGS. 19A to 19C illustrate the forming method of an electronic apparatus including a waveguide according to the embodiment (part 7)

Next, as illustrated in FIG. 19A, the resist pattern 65 is removed, and the seed layer 53 exposed as a result of the removal of the resist pattern 65 is removed. For example, the resist pattern 65 is removed by using acetone or the like, and the seed layer 53 is selectively removed by etching. By removing the seed layer 53, the pin and the sidewall conductor 13 are electrically separated.

Figure 19B:
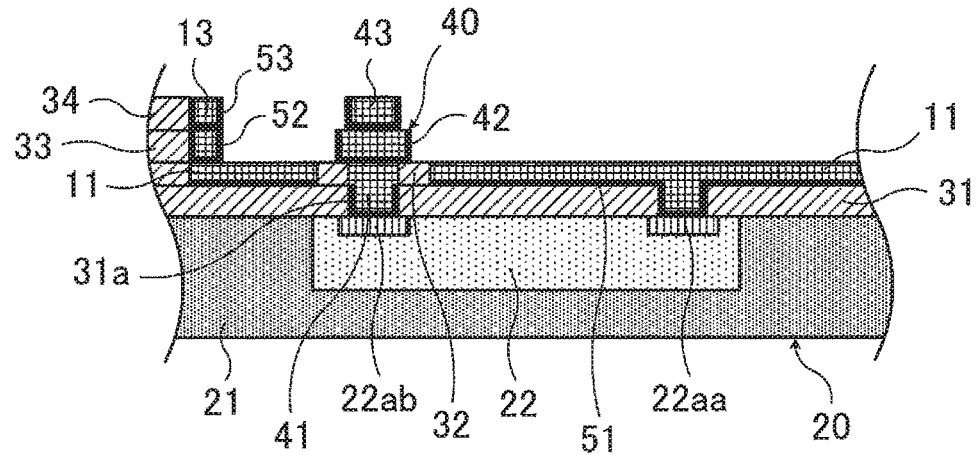

Next, as illustrated in FIG. 19B, the sacrificial layers 62 and 64 are removed. In this step, the sacrificial layers 62 and 64 are removed by using acetone or the like. By removing the sacrificial layers 62 and 64, the hollow portion of the waveguide 10 is formed.

Figure 19C:
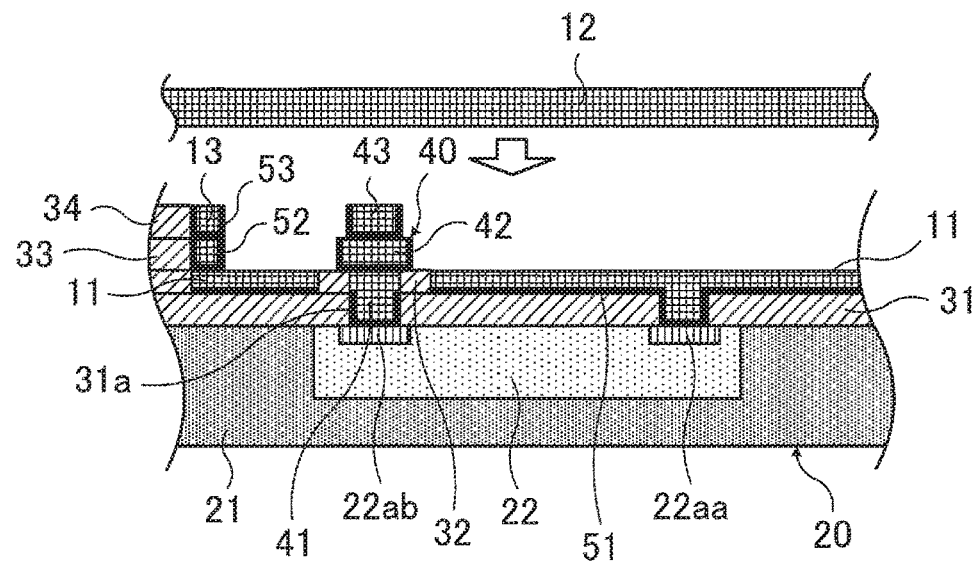
Figure 20:
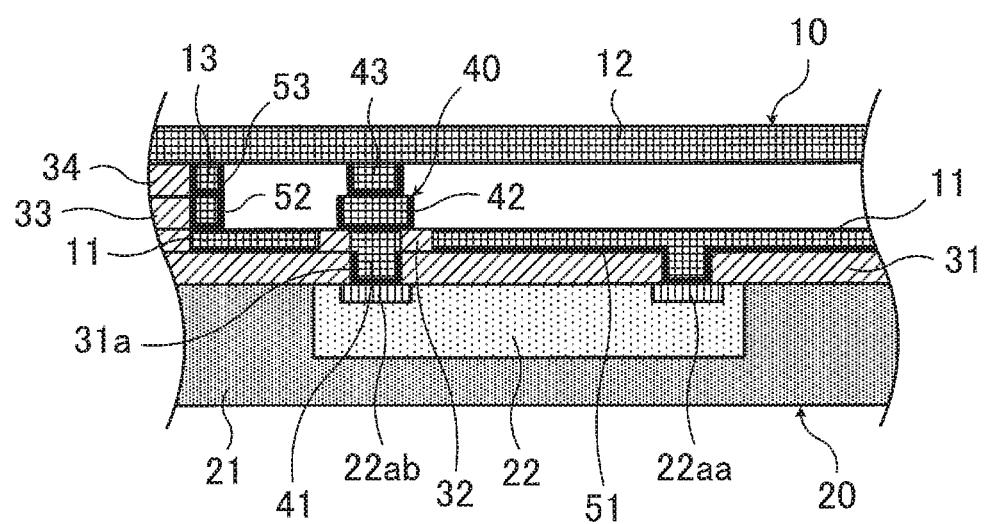
FIG. 20 illustrates the forming method of an electronic apparatus including a waveguide according to the embodiment (part 8)

Next, as illustrated in FIG. 19C, the upper conductor 12 of the waveguide 10 is formed. In this step, for example, metal foil made of Cu or the like is adhered on the insulating layer 34, the sidewall conductor 13, and the conductor pin 40 by lamination. For example, the metal foil has a thickness of 20 μm. By forming the upper conductor 12 in this way, the hollow waveguide 10 as illustrated in FIG. 20 is formed.

When a pseudo wafer that has not been divided into chips is used as the substrate 20, by forming the waveguides 10 as described above, a pseudo wafer in which the resin layer 21 including the semiconductor chips 22 and the waveguides 10 are integrated is obtained. Subsequently, by dividing the pseudo wafer into chips by dicing with a diamond blade or the like, an individual electronic apparatus 1 including a waveguide 10 is obtained.

When a chip obtained by previously dividing a pseudo wafer is used as the substrate 20, by forming the waveguide 10 as described above, an electronic apparatus 1 including a waveguide 10 is obtained.

In this embodiment, the conductor pin 40 having three layers of the pins 41 to 43 has been formed as an example. The conductor pin 40 with four or more pin layers may be formed by repeating the steps from FIGS. 17B to 19A as many times as needed by the number of pin layers after the step in FIG. 19A and performing the steps subsequent to the step in FIG. 19B.

The conductor pin 40 with two pin layers may also be formed by omitting the steps from FIGS. 17B to 19A after performing the step in FIG. 17A, removing the sacrificial layer 62 in accordance with the example in FIG. 19B, and forming the upper conductor 12 in accordance with the example in FIG. 19C.

The waveguide 10 and the electronic apparatus 1 according to the embodiment have thus been described.

The waveguide 10 described above may be configured to have an antenna function.

Figure 21:
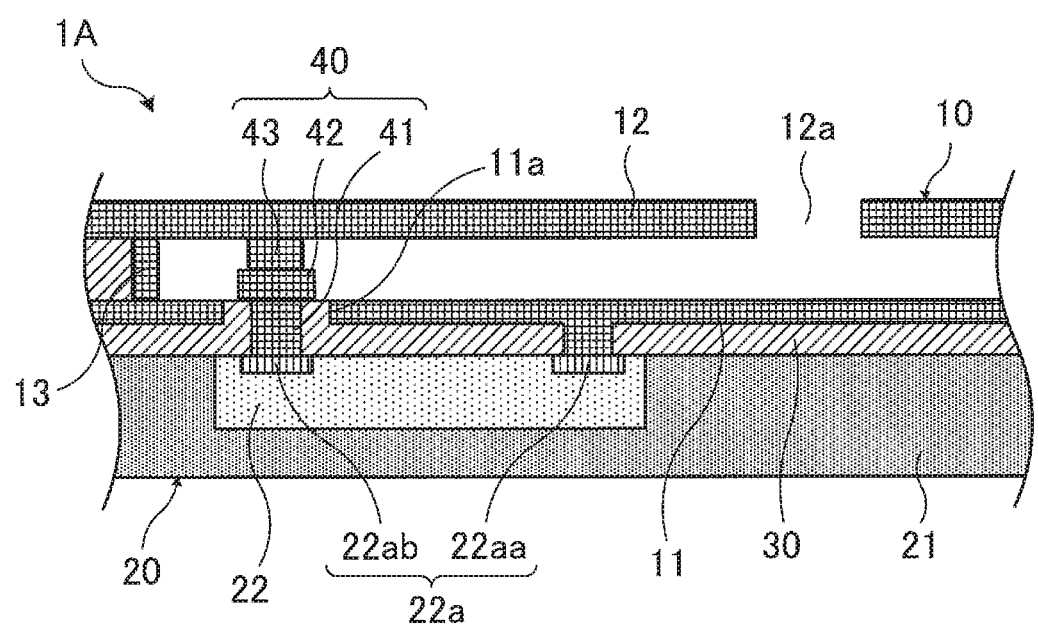
FIG. 21 illustrates an electronic apparatus as a variation.

FIG. 21 illustrates an electronic apparatus as a variation. FIG. 21 is a schematic sectional view of a main portion of an electronic apparatus as a variation.

An electronic apparatus 1A illustrated in FIG. 21 differs from the electronic apparatus 1 illustrated, for example, in FIGS. 3A and 3B in that at least one slot 12a is formed in an upper conductor 12 of a waveguide 10. While the upper conductor 12 has one slot 12a in the example in FIG. 21, the upper conductor 12 may have a plurality of slots 12a. In addition, for example, the shape and the position of an individual slot 12a and the alignment (the slot pattern) of a plurality of slots 12a may be set as appropriate on the basis of various characteristics such as the frequency of a transmitted or received signal.

By forming the slot 12a in the upper conductor 12, the waveguide 10 is allowed to have an antenna function, in addition to the signal transmission function. Namely, the electronic apparatus 1A has a thin waveguide 10 performing signal transmission and reception, having a conversion portion in which a conductor pin 40 is short-circuited to the upper conductor 12, and enabling low transmission loss at the conversion portion.

For example, the electronic apparatus 1A is formed in accordance with the example described with FIGS. 13A to 19C as the method for forming the electronic apparatus 1. To form the electronic apparatus 1A, in the step for forming the upper conductor 12 described with FIG. 19C, the upper conductor 12 that is made of metal foil or the like and that has the slot 12a formed in advance is adhered on an insulating layer 30 (34), a sidewall conductor 13, and the conductor pin 40 by lamination.

Alternatively, the electronic apparatus 1A may be formed by using the following method.

For example, the electronic apparatus 1A is formed by performing the same steps as those in the method for forming the electronic apparatus 1 until the step for forming the seed layer 53 described with FIG. 18A. The subsequent steps will be described with reference to FIGS. 22A to 23.

Figure 22A:
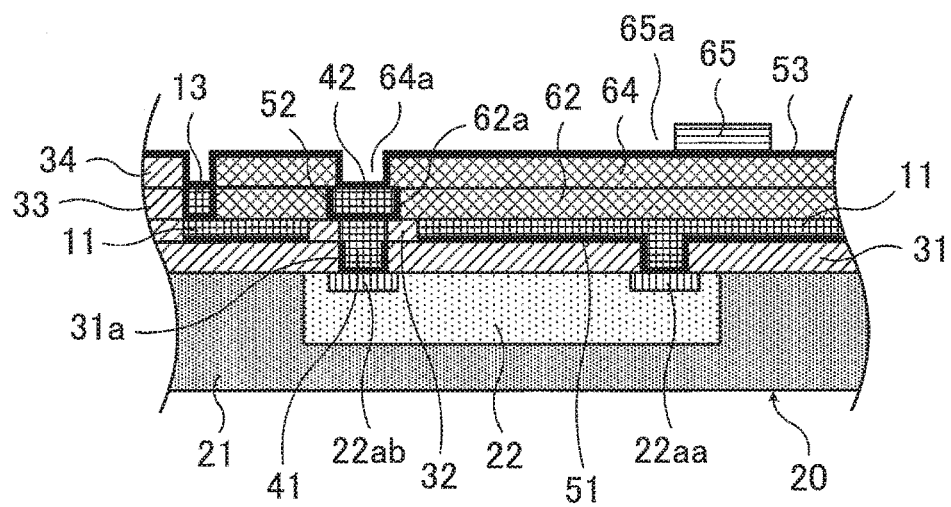
FIGS. 22A to 22C illustrate, as a variation, a forming method of an electronic apparatus including a waveguide (part 1)

First, after the seed layer 53 is formed as illustrated in FIG. 18A, a resist pattern 65 having an opening 65a is formed as illustrated in FIG. 22A. The opening 65a corresponds to an area where a pin 43 of the conductor pin 40 and the sidewall conductor 13 and the upper conductor 12 of the waveguide 10 are to be formed.

Figure 22B:
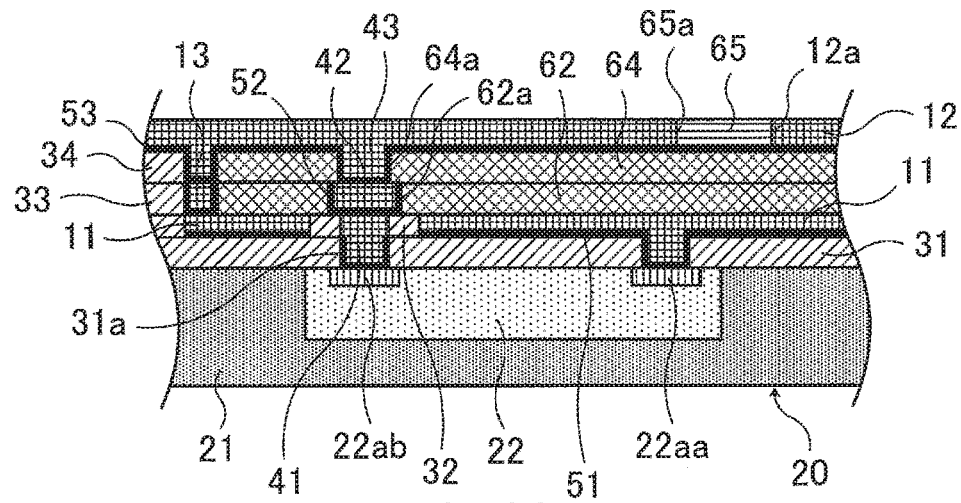

Next, as illustrated in FIG. 22B, the upper conductor 12 that has the pin 43 (the upper layer) of the conductor pin 40, the sidewall conductor 13 (the upper layer) of the waveguide 10, and the slot 12a is formed in the opening 65a of the resist pattern 65. The pin 43, the sidewall conductor 13, and the upper conductor 12 are formed by depositing conductor material such as Cu through electrolytic plating in which the seed layer 53 is used as a power feeding layer.

Figure 22C:
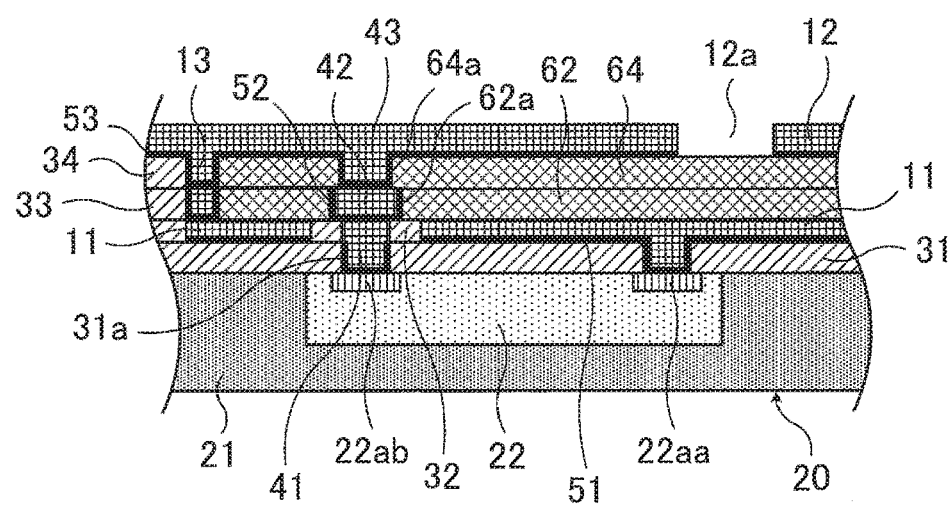

Next, as illustrated in FIG. 22C, the resist pattern 65 is removed, and the seed layer 53 exposed as a result of the removal of the resist pattern 65 is removed.

Figure 23:
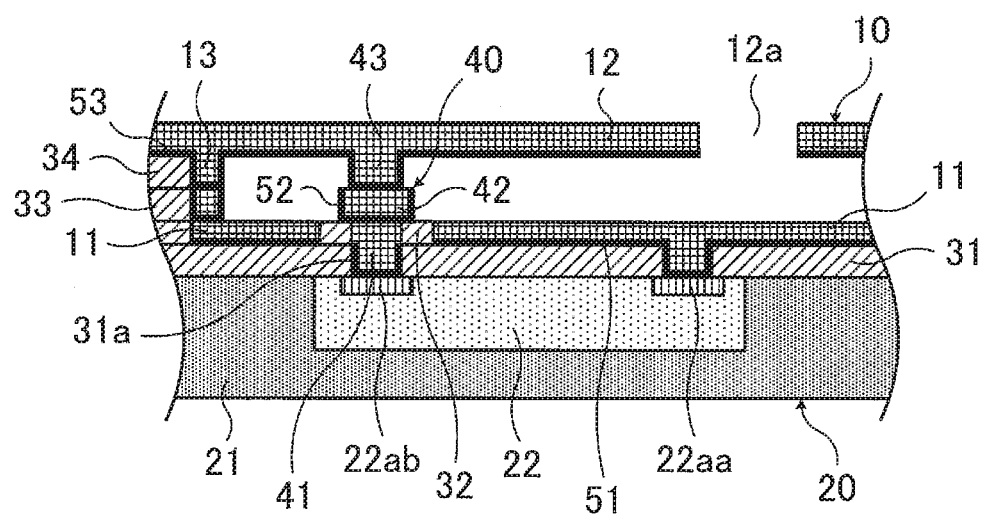
FIG. 23 illustrates, as a variation, the forming method of an electronic apparatus including a waveguide (part 2)

Next, the sacrificial layers 62 and 64 are removed by using an etchant such as acetone. In this way, the waveguide 10 having a hollow portion as illustrated in FIG. 23 is formed. When the sacrificial layers 62 and 64 are removed, the etchant flows into and out of the waveguide 10 through the slot 12a of the upper conductor 12. In this way, the sacrificial layers 62 and 64 are etched and removed from the inside of the waveguide 10.

By using the above method, the electronic apparatus 1A including the waveguide 10 having the slot 12a is formed. In accordance with this method in which the resist pattern 65 is used as a mask and the upper conductor 12 is formed by using plating, slot patterns in various shapes, arrangements, and sizes can accurately be formed.

In this example, after the step in FIG. 18A has been performed, the steps in FIGS. 22A to 23 are performed.

Alternatively, after the pin 43 and the sidewall conductor are formed by performing the step in FIG. 19A, the upper conductor 12 having the slot 12a may be formed in accordance with the procedure in FIGS. 22A to 23.

As described above, the top end of the conductor pin 40 vertically arranged on a signal terminal 22ab of a semiconductor chip 22 is connected and short-circuited to the upper conductor 12 of the waveguide 10 having a lower conductor 11, the sidewall conductor 13, and the upper conductor 12. The diameter of the conductor pin 40 is adjusted so that the impedance matching is achieved between the semiconductor chip 22 and the waveguide 10. This waveguide 10 enables low-loss signal transmission between the semiconductor chip 22 and the waveguide 10 even when the signal transmitted is a high-frequency signal over a millimeter-wave signal.

In addition, as described above, the waveguide 10 can be formed by using a rewiring technique. Thus, the waveguide 10 can be formed to have a wider width than a wiring formed in a semiconductor process and have a thickness as thin as an insulating portion (an insulating layer) of a rewiring layer formed by the rewiring technique. By forming this waveguide 10, the thin electronic apparatus 1 or 1A that achieves low transmission loss is realized.

In a high-frequency range such as the millimeter-wave band, the rewiring technique used for integrating heterogeneous devices including a pseudo SoC as described above is effective in reducing the transmission loss in a transmission line that connects elements. This is because the rewiring technique can make the length of a transmission line between elements relatively short and the width of the transmission line relatively wider than a transmission line formed in a semiconductor process. However, in a frequency range higher than the millimeter-wave band, various problems occur. For example, the transmission line length becomes non-negligible with respect to the wavelength, the conductor loss due to the skin effect is increased, and the dielectric loss of insulating material becomes non-negligible. Thus, when such a high-frequency signal is transmitted, it is effective to use a hollow waveguide in the transmission line. However, there have conventionally been problems regarding how to form a hollow area in a rewiring layer and regarding mode conversion of a signal transmitted between an element and the waveguide if the waveguide is wider and thinner than conventional waveguides.

In contrast, with the waveguide 10 and the forming method thereof described above, the waveguide 10 that is wide, thin, and hollow is realized by using the rewiring technique. In addition, by adjusting the diameter of the conductor pin 40 short-circuited to the waveguide 10, low-loss signal transmission is realized. For example, when a signal having a frequency of 300 GHz is transmitted through a transmission line having a length of 1 mm, while the transmission loss in a microstrip line is −2.5 dB, the transmission loss in the hollow waveguide 10 is as small as −0.5 dB. In addition, for transmitting a signal having a frequency of 300 GHz, the waveguide 10 may be formed to have a width of 500 μm or more, a thickness of around 40 μm, and transmission characteristics of −0.5 dB.

While the inside of the waveguide 10 is hollow in the above example, the waveguide 10 may be provided with a dielectric material therein.

In addition, while a pseudo SoC substrate is used as the substrate 20 in the above example, a different element may alternatively be used as the substrate 20. Alternatively, the waveguide 10 (or the waveguide 10 having an antenna function) may be formed on a semiconductor chip alone or on a circuit board such as a printed circuit board or an interposer.

Figure 24A:
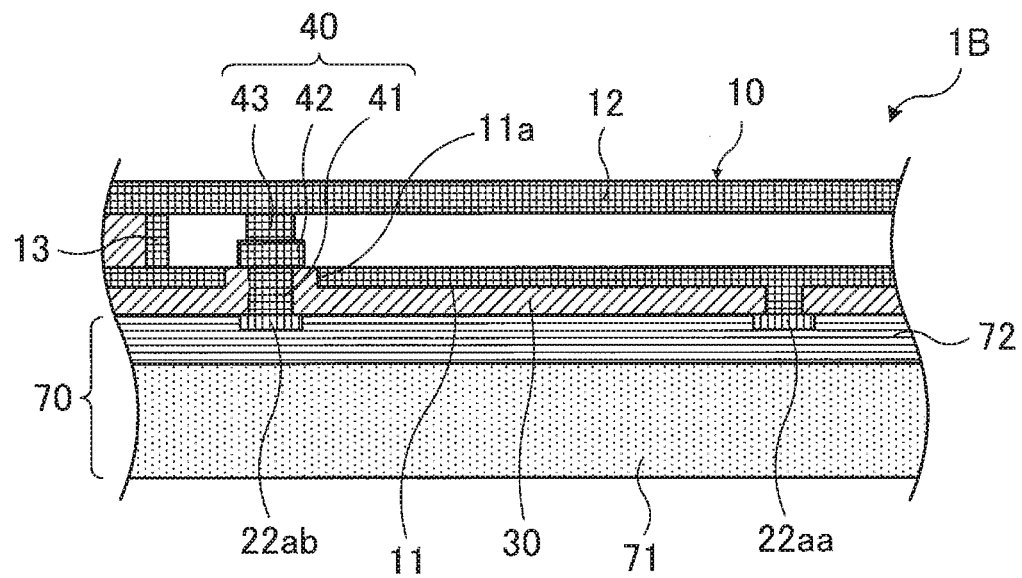
FIGS. 24A and 24B illustrate, as variations, electronic apparatuses, each of which includes a waveguide formed on a semiconductor chip.
Figure 24B:
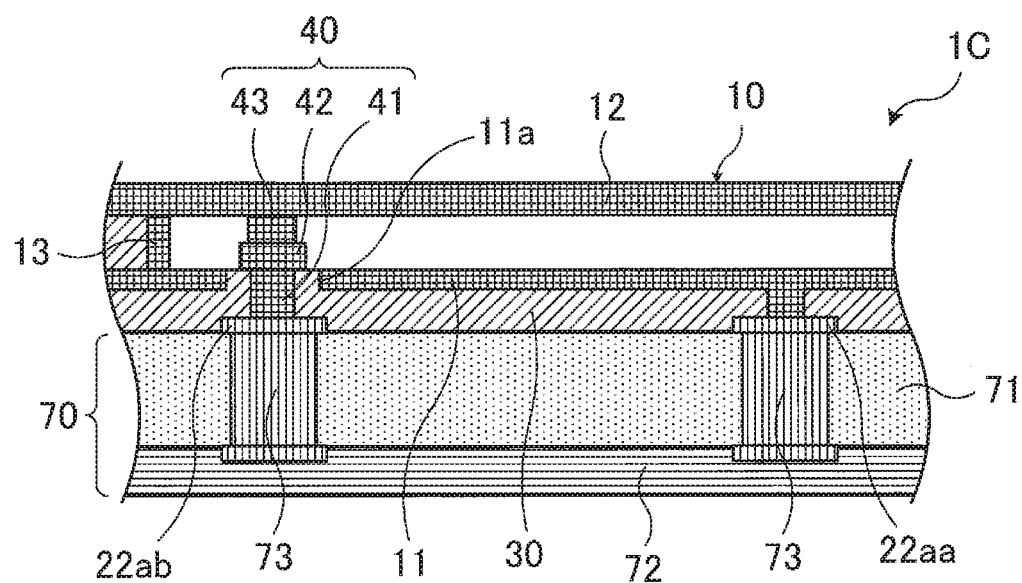

FIGS. 24A and 24B illustrate, as variations, electronic apparatuses, each of which includes a waveguide formed on a semiconductor chip. FIG. 24A is a schematic sectional view of a first configuration example of a main portion of an electronic apparatus including a waveguide formed on a semiconductor chip. FIG. 24B is a schematic sectional view of a second configuration example of a main portion of an electronic apparatus including a waveguide formed on a semiconductor chip.

An electronic apparatus 1B illustrated in FIG. 24A includes a semiconductor chip 70 and a waveguide 10 formed on the semiconductor chip 70. The semiconductor chip 70 includes a semiconductor substrate 71 made of silicon (Si), etc. and a wiring layer 72 formed on the semiconductor substrate 71. Circuit elements (not illustrated) such as transistors, resistors, and capacitors are formed on the front surface (the side on which the wiring layer 72 is arranged) of the semiconductor substrate 71. The wiring layer 72 includes conductor portions (not illustrated) such as vias and wirings that are electrically connected to circuit elements such as transistors formed on the semiconductor substrate 71. The wiring layer 72 also includes an insulating portion (not illustrated) formed around the conductor portion. A GND terminal 22aa and a signal terminal 22ab are arranged in the conductor portion at the top layer of the wiring layer 72. In the electronic apparatus 1B, the waveguide 10 is formed on the wiring layer 72 of this semiconductor chip 70. A conductor pin 40 formed on the signal terminal 22ab is connected to an upper conductor 12 of the waveguide 10. A lower conductor 11 of the waveguide 10 is connected to the GND terminal 22aa.

Likewise, an electronic apparatus 1C illustrated in FIG. 24B includes a semiconductor chip 70 and a waveguide 10 formed on the semiconductor chip 70. In the electronic apparatus 1C, through-electrodes 73 that penetrate a semiconductor substrate 71 and are electrically connected to a wiring layer 72 formed on the front surface (the side on which circuit elements such as transistors, etc. are formed) of the semiconductor substrate 71 are formed on the semiconductor chip 70 by using a TSV (Through Silicon Via) technique or the like. A GND terminal 22aa and a signal terminal 22ab are arranged on the sides of the through-electrodes 73, the sides being opposite to the side on which the wiring layer 72 is arranged. A conductor pin 40 formed on the signal terminal 22ab is connected to an upper conductor 12 of the waveguide 10. The lower conductor 11 of the waveguide 10 is connected to the GND terminal 22aa.

As illustrated in FIGS. 24A and 24B, the waveguide 10 can be formed on the semiconductor chip 70. In this case, the waveguide 10 can be formed on the side on which the wiring layer 72 is arranged or on the back side of the semiconductor substrate 71 (the opposite side of the side on which the wiring layer 72 is arranged). In addition, a slot (the slot 12a, for example) may be formed in the upper conductor 12 of each of the waveguides 10 to provide the electronic apparatuses 1B and 1C with an antenna function.

Figure 25:
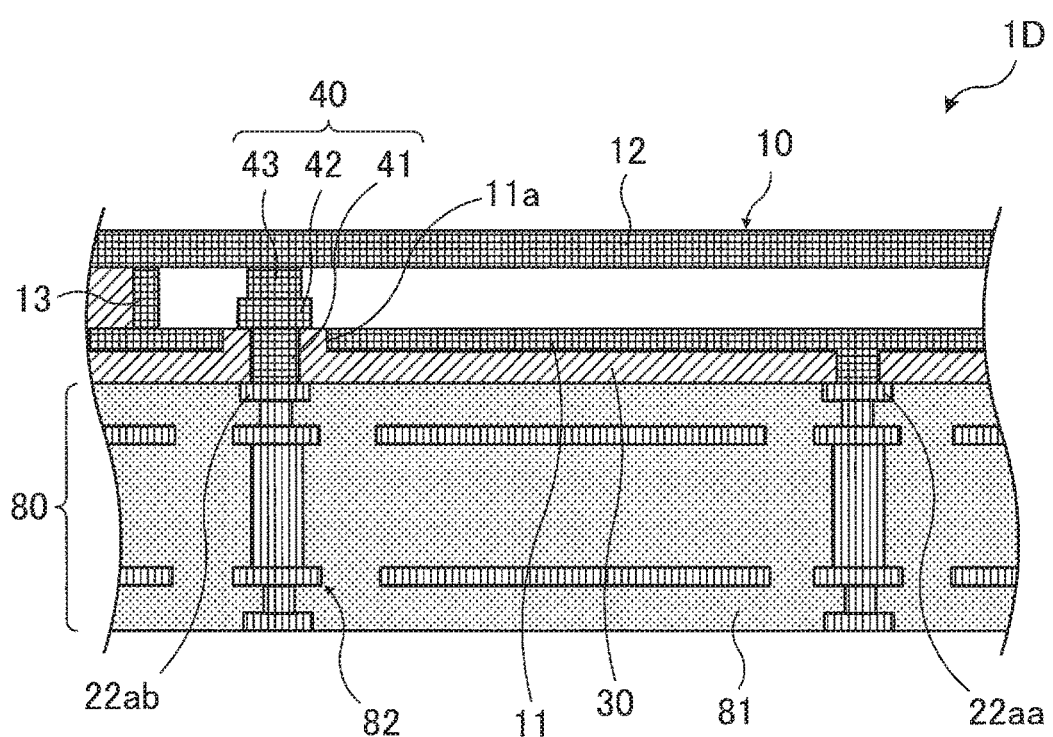
FIG. 25 illustrates, as a variation, an electronic apparatus including a waveguide formed on a circuit board.

FIG. 25 illustrates, as a variation, an electronic apparatus including a waveguide formed on a circuit board. FIG. 25 is a schematic sectional view of a configuration example of a main portion of an electronic apparatus including a waveguide formed on a circuit board.

An electronic apparatus 1D illustrated in FIG. 25 includes a circuit board 80 and a waveguide 10 formed on the circuit board 80. The circuit board 80 includes a substrate 81 and conductor portions 82 (wirings, vias, etc.) arranged, for example, inside and on the front surface of the substrate 81. As an example, FIG. 25 illustrates the circuit board 80 in which the front and back sides (both of the main sides) are electrically connected with each other by the conductor portions 82. For example, the circuit board 80 is an interposer or a printed circuit board in which insulating material such as resin is used as the substrate 81. Alternatively, the circuit board 80 may be an Si interposer in which an Si semiconductor substrate is used as at least a part of the substrate 81. A GND terminal 22aa and a signal terminal 22ab are arranged on the conductor portions 82 exposed on one side of the circuit board 80. In the electronic apparatus 1D, the waveguide 10 is formed on this circuit board 80. A conductor pin 40 formed on the signal terminal 22ab is connected to an upper conductor 12 of the waveguide 10. A lower conductor 11 of the waveguide 10 is connected to the GND terminal 22aa.

As illustrated in FIG. 25, the waveguide 10 can be formed on the circuit board 80. In addition, a slot (the slot 12a, for example) can be formed in the upper conductor 12 of the waveguide 10 to provide the electronic apparatuses 1D with an antenna function.

Embodiments as examples have thus been described.

According to the embodiments discussed herein, a small electronic apparatus including a waveguide that enables low-loss signal transmission is formed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. An electronic apparatus comprising:
   a substrate which includes a resin layer that has a first surface and which includes a semiconductor element that has a terminal and the semiconductor element is embedded in the resin layer, the terminal being formed on a second surface of the semiconductor element, an upper surface of the terminal being located in the second surface and being exposed on the first surface;
   a waveguide which includes a lower conductor that is formed above the first surface of the resin layer of the substrate and that has an opening at a position opposite to the upper surface of the terminal and which includes an upper conductor that is arranged above the lower conductor; and
   a columnar conductor which is formed over the upper surface of the terminal, which penetrates the opening without contacting the lower conductor, and which is connected to the upper conductor, a bottom end of the columnar conductor being in directly contact with the upper surface of the terminal, an upper end of the columnar conductor being in directly contact with a bottom surface of the upper conductor.
2. The electronic apparatus according to claim 1, wherein a height from the lower conductor to the upper conductor is equal to or less than one fourth of a wavelength of a signal transmitted between the terminal and the waveguide.

3. The electronic apparatus according to claim 1,
wherein the columnar conductor includes:
 a first conductor portion which extends from the upper surface of the terminal into the opening; and
 a second conductor portion which is formed over the first conductor portion and which is connected to the upper conductor.

4. The electronic apparatus according to claim 3, wherein the second conductor portion has a diameter different from a diameter of the first conductor portion.

5. The electronic apparatus according to claim 3, wherein the second conductor portion includes a plurality of portions having diameters different from each other.

6. The electronic apparatus according to claim 1, wherein a diameter of the opening is set so that a characteristic impedance represents a predetermined value when the lower conductor and a portion of the columnar conductor located in the opening forms a coaxial line.

7. The electronic apparatus according to claim 1, wherein the upper conductor has a slot.

8. The electronic apparatus according to claim 1, wherein the waveguide is hollow.

9. An electronic apparatus manufacturing method comprising:
 preparing a substrate which includes a resin layer that has a first surface and which includes a semiconductor element that has a terminal and the semiconductor element is embedded in the resin layer, the terminal being formed on a second surface of the semiconductor element, an upper surface of the terminal being located in the second surface and being exposed on the first surface; and
 forming, above the first surface of the resin layer of the substrate, a waveguide which includes a lower conductor that has an opening at a position opposite to the upper surface of the terminal and which includes an upper conductor arranged above the lower conductor,
 wherein the forming of the waveguide includes forming, over the upper surface of the terminal, a columnar conductor which penetrates the opening without contacting the lower conductor and which is connected to the upper conductor, a bottom end of the columnar conductor being in directly contact with the upper surface of the terminal, an upper end of the columnar conductor being in directly contact with a bottom surface of the upper conductor.

10. The electronic apparatus manufacturing method according to claim 9,
wherein the forming of the waveguide includes:
 forming, above the substrate, the lower conductor which has the opening and a first conductor portion which extends from the upper surface of the terminal into the opening without contacting the lower conductor;
 forming a second conductor portion over the first conductor portion to form the columnar conductor having the first conductor portion and the second conductor portion; and
 forming, above the lower conductor, the upper conductor connected to the second conductor portion.

11. The electronic apparatus manufacturing method according to claim 10, comprising:
 forming, after the forming of the lower conductor and the first conductor portion, a sacrificial layer having a through hole at a position corresponding to the first conductor portion;
 forming the second conductor portion in the through hole in the forming of the second conductor portion;
 forming the upper conductor above the sacrificial layer and the second conductor portion in the forming of the upper conductor; and
 removing the sacrificial layer after the forming of the upper conductor.

12. The electronic apparatus manufacturing method according to claim 10, the method comprising:
 forming, after the forming of the lower conductor and the first conductor portion, a sacrificial layer having a through hole at a position corresponding to the first conductor portion;
 forming the second conductor portion in the through hole in the forming of the second conductor portion;
 removing the sacrificial layer after the forming of the second conductor portion; and
 forming the upper conductor after the removing of the sacrificial layer.

13. The electronic apparatus manufacturing method according to claim 10,
wherein the forming of the second conductor portion includes forming a plurality of portions having diameters different from each other.

14. The electronic apparatus manufacturing method according to claim 13,
wherein the forming of the plurality of portions includes forming each of the plurality of portions with a diameter set so that impedance matching between the terminal and the waveguide is achieved.

* * * * *